(12) United States Patent
Lee

(10) Patent No.: US 11,901,017 B2
(45) Date of Patent: Feb. 13, 2024

(54) SEMICONDUCTOR MEMORY DEVICE AND METHOD OF OPERATING THE SAME

(71) Applicant: SK hynix Inc., Icheon-si Gyeonggi-do (KR)

(72) Inventor: Hee Youl Lee, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 240 days.

(21) Appl. No.: 17/493,438

(22) Filed: Oct. 4, 2021

(65) Prior Publication Data

US 2022/0366989 A1 Nov. 17, 2022

(30) Foreign Application Priority Data

May 17, 2021 (KR) .................. 10-2021-0063708

(51) Int. Cl.
| | | |
|---|---|---|
| *G11C 11/34* | (2006.01) | |
| *G11C 16/26* | (2006.01) | |
| *G11C 16/24* | (2006.01) | |
| *G11C 16/10* | (2006.01) | |
| *G11C 16/34* | (2006.01) | |
| *G11C 16/08* | (2006.01) | |
| G11C 11/56 | (2006.01) | |
| G11C 16/04 | (2006.01) | |

(52) U.S. Cl.
CPC .............. *G11C 16/26* (2013.01); *G11C 16/08* (2013.01); *G11C 16/10* (2013.01); *G11C 16/24* (2013.01); *G11C 16/3459* (2013.01); *G11C 11/56* (2013.01); *G11C 16/0483* (2013.01)

(58) Field of Classification Search
CPC ......... G11C 16/10; G11C 16/30; G11C 16/12; G11C 16/0483; H01L 27/115
USPC .................. 365/185.18, 189.15, 185.22, 203
See application file for complete search history.

(56) References Cited

U.S. PATENT DOCUMENTS

| | | | | |
|---|---|---|---|---|
| 2010/0067299 | A1* | 3/2010 | Futatsuyama ........ | G11C 16/344 365/185.17 |
| 2011/0013450 | A1* | 1/2011 | Murin ................. | G11C 11/5628 365/185.24 |
| 2018/0261296 | A1* | 9/2018 | Choi ...................... | G11C 16/08 |
| 2021/0082499 | A1* | 3/2021 | Date ................... | G11C 11/5628 |
| 2021/0090651 | A1* | 3/2021 | Kim ................... | G11C 13/0033 |

FOREIGN PATENT DOCUMENTS

| | | |
|---|---|---|
| KR | 1020110132072 A | 12/2011 |
| KR | 1020130022228 A | 3/2013 |

* cited by examiner

*Primary Examiner* — Son T Dinh
(74) *Attorney, Agent, or Firm* — William Park & Associates Ltd.

(57) ABSTRACT

A read operation on selected memory cells may be performed by a method of operating a semiconductor memory device. The method may include determining a read voltage to be used in the read operation among first to $2^N-1$-th read voltages, applying the determined read voltage to a selected word line connected to the selected memory cells, and applying a read pass voltage to unselected word lines based on whether the determined read voltage is a first read voltage. Here, N may be a natural number of 2 or more.

19 Claims, 27 Drawing Sheets

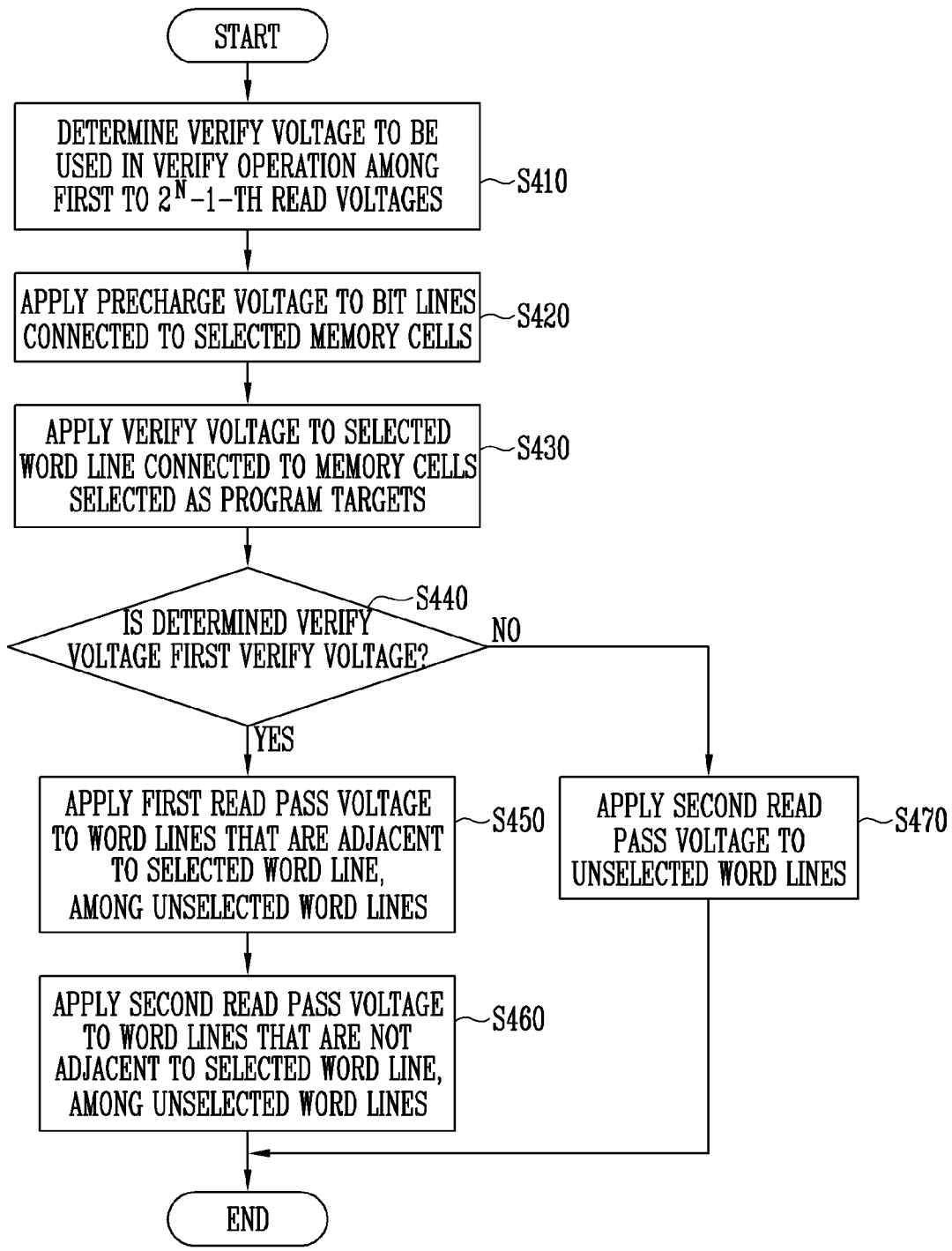

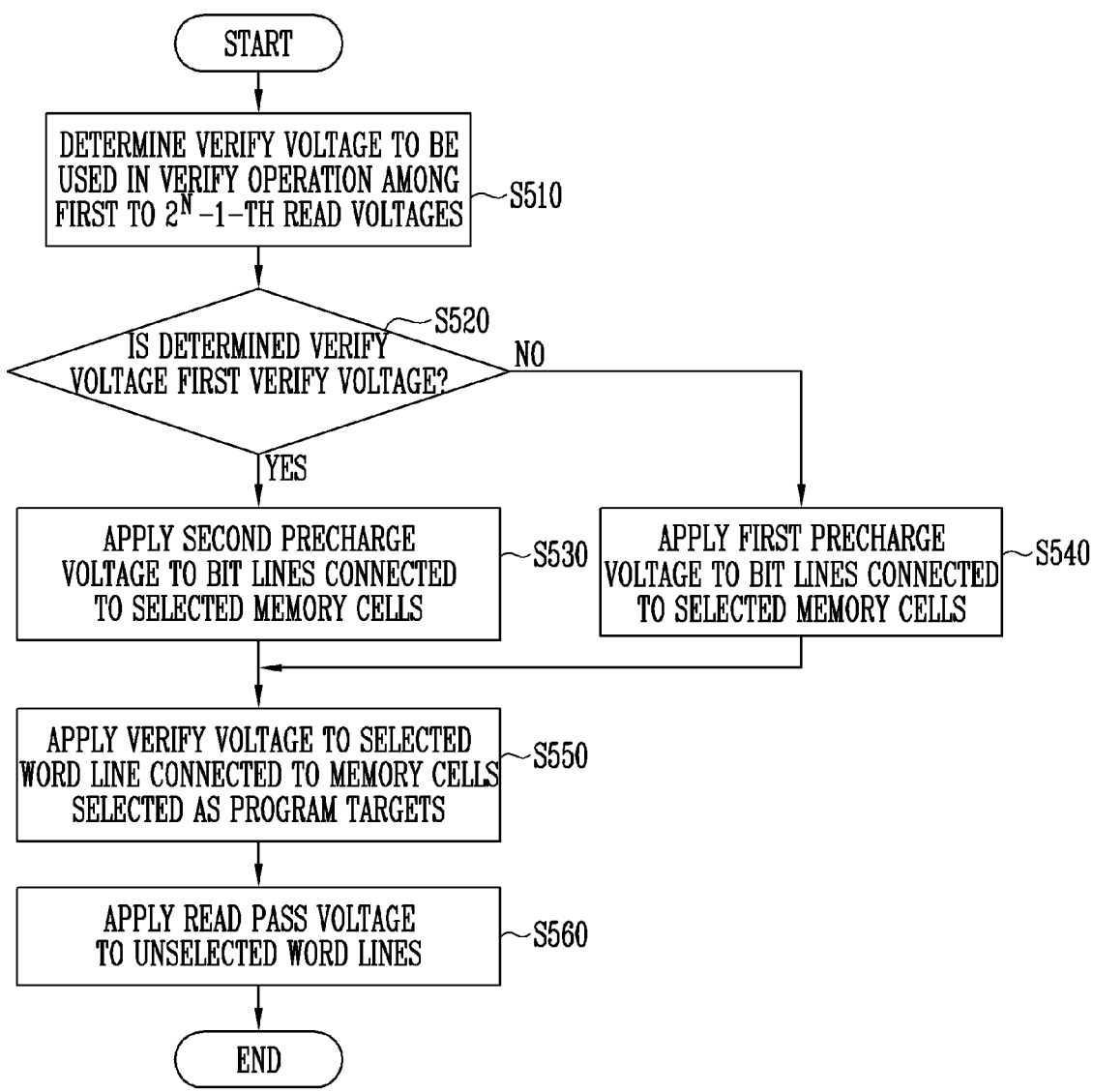

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2021-0063708, filed on May 17, 2021, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor memory device and a method of operating the semiconductor memory device.

2. Related Art

Generally, a semiconductor memory device may have a two-dimensional structure in which strings are horizontally arranged on a semiconductor substrate, or a three-dimensional structure in which strings are vertically stacked on a semiconductor substrate. The three-dimensional semiconductor memory device may be a semiconductor memory device which is devised to overcome a limitation in the degree of integration of the two-dimensional memory device, and may include a plurality of memory cells which are vertically stacked on a semiconductor substrate. A controller may control the operation of the semiconductor memory device.

SUMMARY

Various embodiments of the present disclosure are directed to a semiconductor memory device capable of improving read and program performance, and a method of operating the semiconductor memory device.

An embodiment of the present disclosure may provide for a method of operating a semiconductor memory device configured to perform a read operation on selected memory cells, the method including: determining a read voltage to be used in the read operation among first to $2^N-1$-th read voltages; applying the determined read voltage to a selected word line connected to the selected memory cells; and applying a read pass voltage to unselected word lines based on whether the determined read voltage is the first read voltage. Here, N may be a natural number of 2 or more.

In an embodiment, applying the read pass voltage to the unselected word lines based on whether the determined read voltage is the first read voltage may include, in response to a determination that the determined read voltage is the first read voltage: applying a first read pass voltage to word lines that are not adjacent to the selected word line among the unselected word lines; and applying a second read pass voltage greater than the first read pass voltage to word lines that are adjacent to the selected word line among the unselected word lines.

In an embodiment, applying the read pass voltage to the unselected word lines based on whether the determined read voltage is the first read voltage may include applying a first read pass voltage to the unselected word lines, in response to a determination that the determined read voltage is not the first read voltage.

In an embodiment, the method may further include applying a precharge voltage to bit lines connected to the selected memory cells.

In an embodiment, the first read voltage may be a read voltage to determine whether the selected memory cells are in an erased state or a first programmed state.

An embodiment of the present disclosure may provide for a method of operating a semiconductor memory device configured to perform a read operation on selected memory cells. The method may include: determining a read voltage to be used in the read operation among first to $2^N-1$-th read voltages; and applying any one of a first precharge voltage and a second precharge voltage greater than the first precharge voltage to bit lines connected to the selected memory cells, based on whether the determined read voltage is the first read voltage. Here, the variable N may be a natural number of 2 or more.

In an embodiment, applying any one of the first precharge voltage and the second precharge voltage greater than the first precharge voltage to the bit lines connected to the selected memory cells, based on whether the determined read voltage is the first read voltage may include applying the first precharge voltage to the bit lines, in response to a determination that the determined read voltage is the first read voltage.

In an embodiment, the method may further include: applying the determined read voltage to a selected word line connected to the selected memory cells; applying a first read pass voltage to word lines that are not adjacent to the selected word line, among unselected word lines; and applying a second read pass voltage greater than the first read pass voltage to word lines that are adjacent to the selected word line among the unselected word lines.

In an embodiment, applying any one of the first precharge voltage and the second precharge voltage greater than the first precharge voltage to the bit lines connected to the selected memory cells, based on whether the determined read voltage is the first read voltage may include applying the second precharge voltage to the bit lines, in response to a determination that the determined read voltage is not the first read voltage.

In an embodiment, the method may further include: applying the determined read voltage to a selected word line connected to the selected memory cells; and applying a first read pass voltage to the unselected word lines.

An embodiment of the present disclosure may provide for a method of operating a semiconductor memory device configured to perform a program operation on selected memory cells. The program operation may include a plurality of program loops, and each of the plurality of program loops may include a program pulse application operation and a program verify operation. The program verify operation may include: determining a verify voltage to be used in a verify operation among first to $2^N-1$-th verify voltages; applying the determined verify voltage to a selected word line connected to the selected memory cells; and applying a read pass voltage to unselected words line based on whether the determined verify voltage is the first verify voltage. Here, the variable N may be a natural number of 2 or more.

In an embodiment, applying the read pass voltage to the unselected word lines based on whether the determined verify voltage is the first verify voltage may include, in response to a determination that the determined verify voltage is the first verify voltage: applying a first read pass voltage to word lines that are adjacent to the selected word line among the unselected word lines; and applying a second read pass voltage greater than the first read pass voltage to word lines that are not adjacent to the selected word line among the unselected word lines.

In an embodiment, applying the read pass voltage to the unselected word lines based on whether the determined verify voltage is the first verify voltage may include applying a second read pass voltage to the unselected word lines, in response to a determination that the determined verify voltage is not the first verify voltage.

In an embodiment, the program verify operation may further include applying a precharge voltage to bit lines connected to the selected memory cells.

In an embodiment, the first verify voltage may be a voltage for verifying threshold voltages of memory cells to be programmed to a first programmed state among first to $2^N-1$-th programmed states.

An embodiment of the present disclosure may provide for a method of operating a semiconductor memory device configured to perform a program operation on selected memory cells. The program operation may include a plurality of program loops, and each of the plurality of program loops comprises a program pulse application operation, and a program verify operation. The program verify operation may include: determining a verify voltage to be used in a verify operation among first to $2^N-1$-th verify voltages; and applying any one of a first precharge voltage and a second precharge voltage greater than the first precharge voltage to bit lines connected to the selected memory cells, based on whether the determined verify voltage is the first verify voltage. The variable N may be a natural number of 2 or more.

In an embodiment, applying any one of the first precharge voltage and the second precharge voltage greater than the first precharge voltage to the bit lines connected to the selected memory cells, based on whether the determined verify voltage is the first verify voltage may include applying the second precharge voltage to the bit lines, in response to a determination that the determined verify voltage is the first verify voltage.

In an embodiment, applying any one of the first precharge voltage and the second precharge voltage greater than the first precharge voltage to the bit lines connected to the selected memory cells, based on whether the determined verify voltage is the first verify voltage may include applying the first precharge voltage to the bit lines, in response to a determination that the determined verify voltage is not the first verify voltage.

In an embodiment, the program verify operation may include: applying the determined verify voltage to a selected word line connected to the selected memory cells; and applying a read pass voltage to unselected word lines.

BRIEF DESCRIPTION OF THE DRAWINGS

FIG. 18 is a flowchart illustrating a method of operating the semiconductor memory device in accordance with an embodiment of the present disclosure.

FIG. 20 is a flowchart illustrating a method of operating the semiconductor memory device in accordance with an embodiment of the present disclosure.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Figure 1:
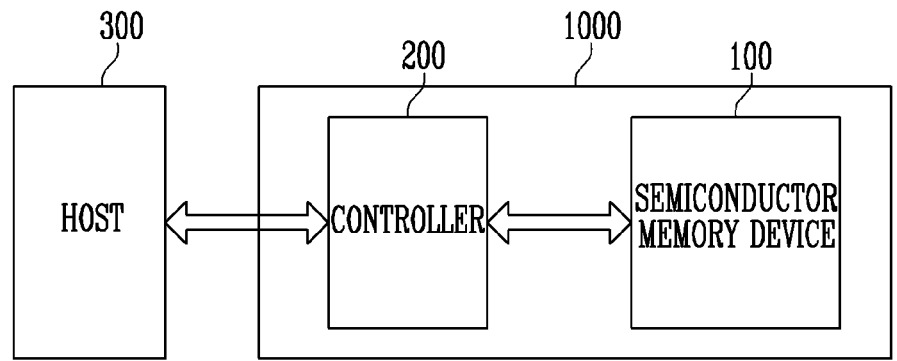
FIG. 1 is a block diagram illustrating a memory system including a semiconductor memory device and a controller in accordance with an embodiment of the present disclosure.

FIG. 1 is a block diagram illustrating a memory system 1000 including a semiconductor memory device 100 and a controller 200 in accordance with an embodiment of the present disclosure.

Referring to FIG. 1, the memory system 1000 may include the semiconductor memory device 100 and the controller 200. The memory system 1000 may communicate with a host 300. The controller 200 may control overall operation of the semiconductor memory device 100. The controller 200 may control the operation of the semiconductor memory device 100 based on a command received from the host 300.

Figure 2:
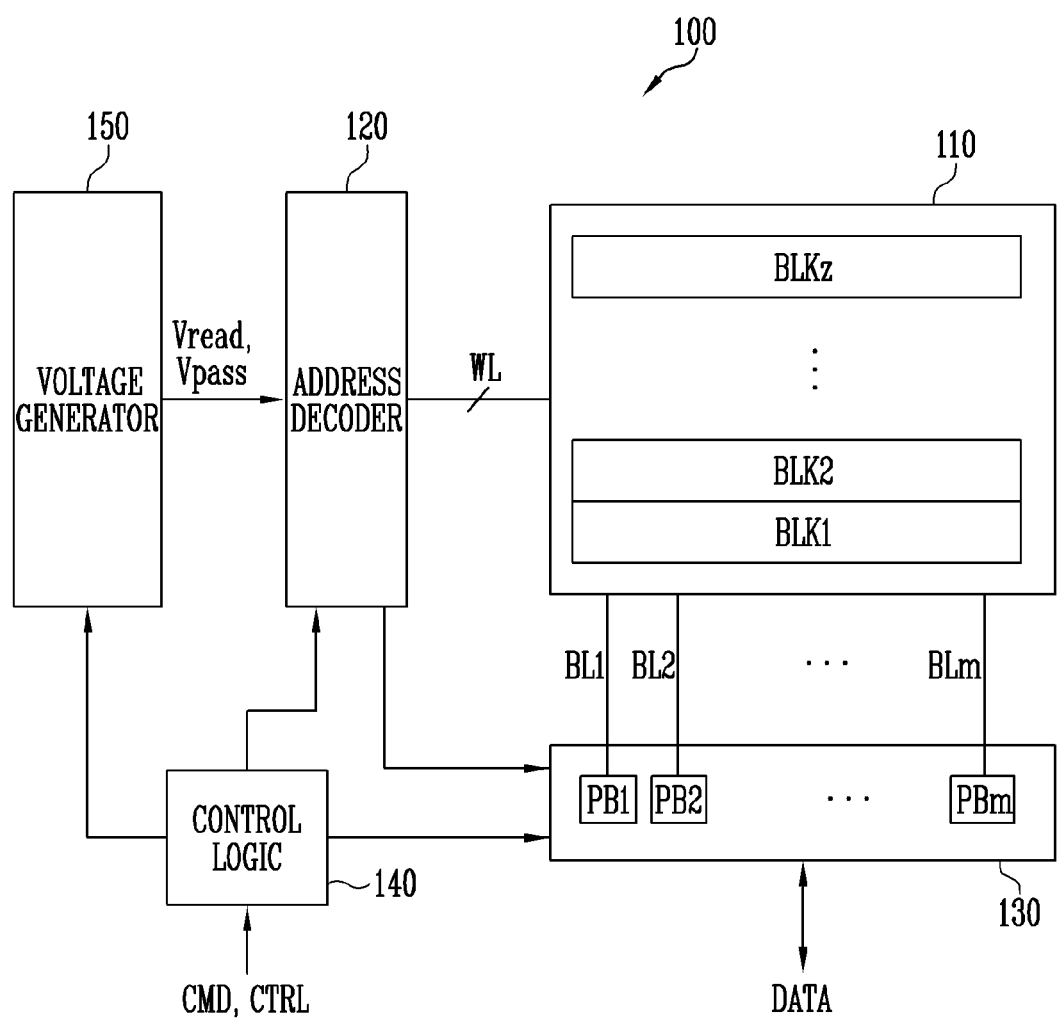
FIG. 2 is a block diagram illustrating the semiconductor memory device of FIG. 1.

FIG. 2 is a block diagram illustrating the semiconductor memory device 100 of FIG. 1.

Referring to FIG. 2, the semiconductor memory device 100 includes a memory cell array 110, an address decoder 120, a read/write circuit 130, control logic 140, and a voltage generator 150.

The memory cell array 110 includes a plurality of memory blocks BLK1 to BLKz. The memory blocks BLK1 to BLKz may be connected to the address decoder 120 through word lines WL. The memory blocks BLK1 to BLKz may be connected to the read/write circuit 130 through bit lines BL1 to BLm. Each of the memory blocks BLK1 to BLKz includes a plurality of memory cells. In an embodiment, the memory cells may be nonvolatile memory cells and be formed of nonvolatile memory cells having a vertical channel structure. The memory cell array 110 may be formed to have a two-dimensional structure. In an embodiment, the memory cell array 110 may be formed to have a three-dimensional structure. Each of the memory cells included in the memory cell array may store at least one bit of data. In an embodiment, each of the memory cells included in the memory cell array 110 may be a single-level cell (SLC), which may store one bit of data. In an embodiment, each of the memory cells included in the memory cell array 110 may be a multi-level cell (MLC), which may store two bits of data. In an embodiment, each of the memory cells included in the memory cell array 110 may be a triple-level cell (TLC), which stores three bits of data. In an embodiment, each of the memory cells included in the memory cell array 110 may be a quad-level cell (QLC), which stores four bits of data. In various embodiments, the memory cell array 110 may include a plurality of memory cells each of which may store 5 or more bits of data.

The address decoder 120, the read/write circuit 130, and the voltage generator 150 may be operated as peripheral circuits for driving the memory cell array 110. The address decoder 120 may be connected to the memory cell array 110 through the word lines WL. The address decoder 120 may operate under control of the control logic 140. The address decoder 120 may receive addresses through an input/output buffer (not shown) provided in the semiconductor memory device 100.

The address decoder 120 may decode a block address among the received addresses. The address decoder 120 may select at least one memory block based on the decoded block address. When a read voltage application operation is performed during a read operation, the address decoder 120 may apply a read voltage $V_{READ}$ generated from the voltage generator 150 to a selected word line of a selected memory block, and apply a pass voltage $V_{PASS}$ to the other unselected word lines. During a program verify operation, the address decoder 120 may apply a verify voltage generated from the voltage generator 150 to a selected word line of a selected memory block, and apply a pass voltage $V_{PASS}$ to the other unselected word lines.

The address decoder 120 may decode a column address among the received addresses. The address decoder 120 may transmit the decoded column address to the read/write circuit 130.

The read operation or the program operation of the semiconductor memory device 100 may be performed on a page basis. Addresses received in a request for a read or program operation may include a block address, a row address, and a column address. The address decoder 120 may select one memory block and one word line based on the block address and the row address. The column address may be decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The read/write circuit 130 may be operated as a read circuit during a read operation of the memory cell array 110 and as a write circuit during a write operation. The page buffers PB1 to PBm are connected to the memory cell array 110 through the bit lines BL1 to BLm. During a read operation or a program verify operation, to sense threshold voltages of the memory cells, the page buffers PB1 to PBm may continuously supply sensing current to the bit lines connected to the memory cells, and each page buffer may sense, through a sensing node, a change in the amount of flowing current depending on a programmed state of a corresponding memory cell and latch it as sensing data. The read/write circuit 130 may operate in response to page buffer control signals output from the control logic 140.

During a read operation, the read/write circuit 130 may sense data of the memory cells and temporarily store read-out data, and then output data DATA to the input/output buffer (not shown) of the semiconductor memory device 100. In an embodiment, the read/write circuit 130 may include a column select circuit or the like as well as the page buffers (or page registers).

The control logic 140 is connected to the address decoder 120, the read/write circuit 130, and the voltage generator 150. The control logic 140 may receive a command CMD and a control signal CTRL through the input/output buffer (not shown) of the semiconductor memory device 100. The control logic 140 may control the overall operation of the semiconductor memory device 100 in response to the control signal CTRL. The control logic 140 may output a control signal for controlling the sensing node precharge potential levels of the plurality of page buffers PB1 to PBm. The control logic 140 may control the read/write circuit 130 to perform a read operation of the memory cell array 110. The control logic 140 may be implemented as hardware, software, or a combination of hardware and software. For example, the control logic 140 may be a control logic circuit operating in accordance with an algorithm and/or a processor executing control logic code.

The voltage generator 150 may generate a read voltage $V_{READ}$ and a pass voltage $V_{PASS}$ during a read operation in response to a control signal output from the control logic 140. The voltage generator 150 may include, so as to generate a plurality of voltages having various voltage levels, a plurality of pumping capacitors configured to receive an internal supply voltage, and may generate a plurality of voltages by selectively enabling the plurality of pumping capacitors under control of the control logic 140.

As described above, the voltage generator 150 may include a charge pump. The charge pump may include the plurality of pumping capacitors described above. The detailed configuration of the charge pump included in the voltage generator 150 may be designed in various ways, as needed.

The address decoder 120, the read/write circuit 130, and the voltage generator 150 may function as peripheral circuits for performing a read operation, a write operation, or an erase operation on the memory cell array 110. The peripheral circuits may perform a read operation, a write operation, or an erase operation on the memory cell array 110 under control of the control logic 140.

Figure 3:
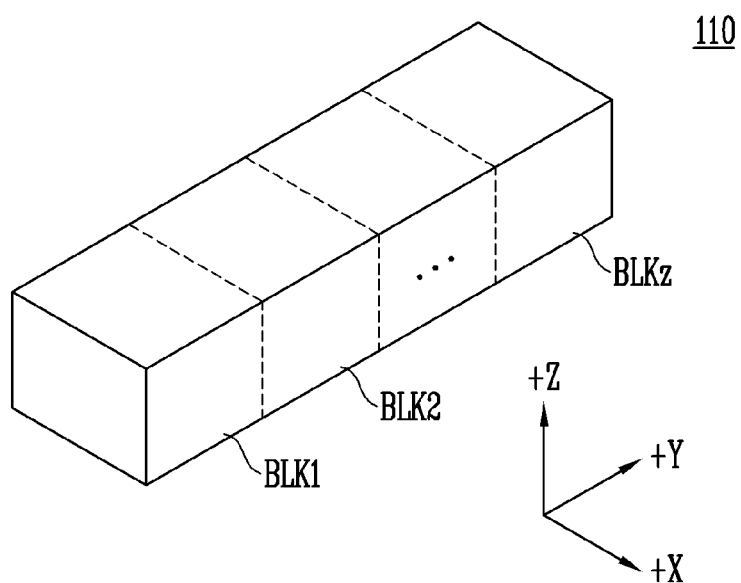
FIG. 3 is a diagram illustrating an embodiment of a memory cell array of FIG. 2.

FIG. 3 is a diagram illustrating an embodiment of the memory cell array 110 of FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 4 and 5.

Figure 4:
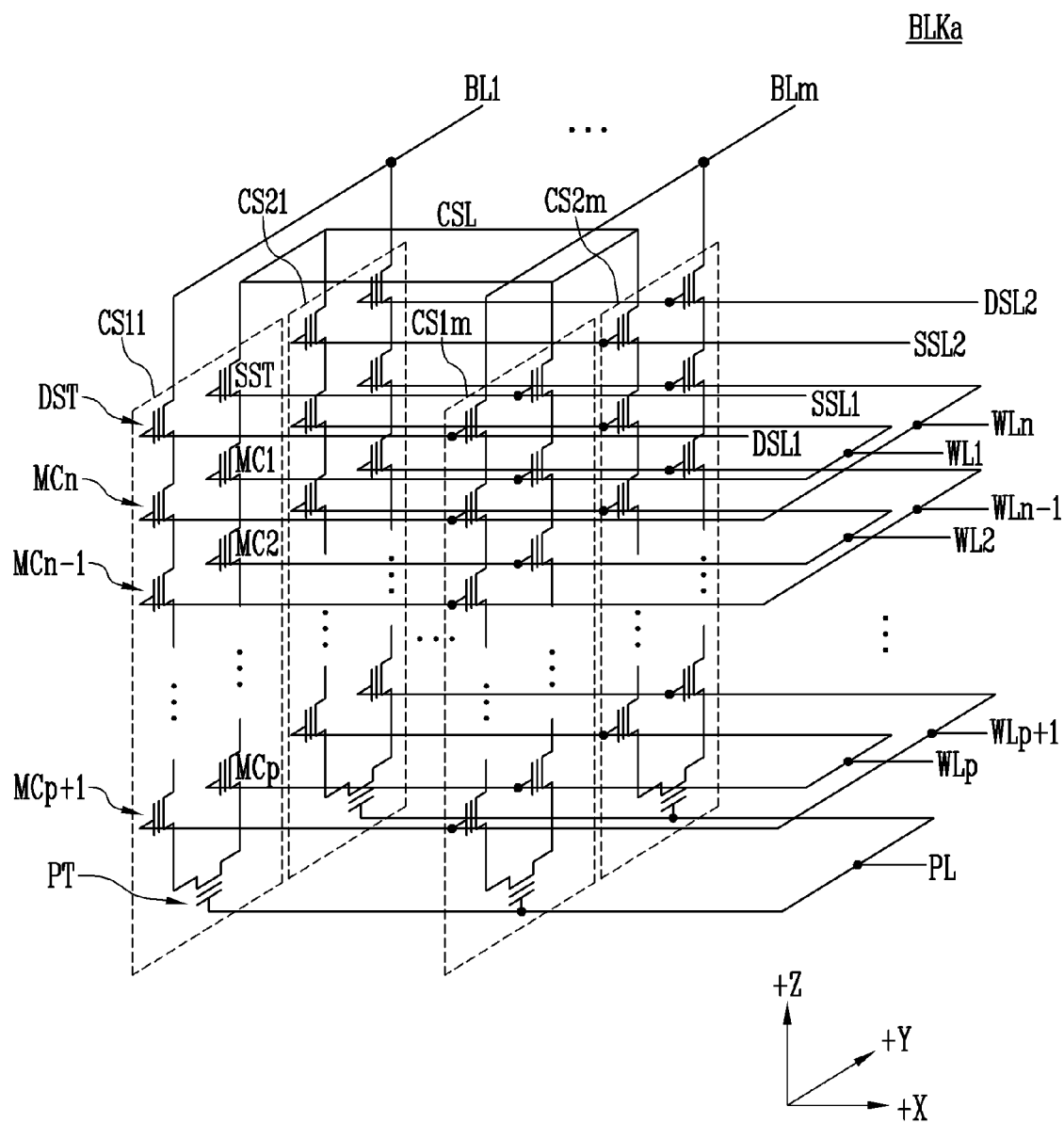
FIG. 4 is a circuit diagram illustrating any one memory block BLKa of memory blocks BLK1 to BLKz of FIG. 3, in accordance with an embodiment of the present disclosure.

FIG. 4 is a circuit diagram illustrating any one memory block BLKa of memory blocks BLK1 to BLKz of FIG. 3.

Referring to FIG. 4, the memory block BLKa may include a plurality of cell strings CS11 to CS1*m* and CS21 to CS2*m*. In an embodiment, each of the cell strings CS11 to CS1*m* and CS21 to CS2*m* may be formed in a 'U' shape. In the memory block BLKa, m cell strings may be arranged in a row direction (i.e., the +X direction). In FIG. 4, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1*m* and CS21 to CS2*m* may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between the common source line CSL and the memory cells MC1 to MCp.

In an embodiment, source select transistors of cell strings arranged in the same row are connected to a source select line extending in a row direction, and source select transistors of cell strings arranged in different rows are connected to different source select lines. In FIG. 4, source select transistors of the cell strings CS11 to CS1*m* in a first row are connected to a first source select line SSL1. Source select transistors of the cell strings CS21 to CS2*m* in a second row are connected to a second source select line SSL2.

In an embodiment, the source select transistors of the cell strings CS11 to CS1*m* and CS21 to CS2*m* may be connected in common to a single source select line.

The first to n-th memory cells MC1 to MCn in each cell string are connected between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are connected in series between the source select transistor SST and the pipe transistor PT. The p+1-th to n-th memory cells MCp+1 to MCn are successively arranged in the +Z direction and are connected in series between the pipe transistor PT and the drain select transistor DST. The first to p-th memory cells MC1 to MCp and the p+1-th to n-th memory cells MCp+1 to MCn are connected to each other through the pipe transistor PT. The gates of the first to n-th memory cells MC1 to MCn of each cell string are connected to first to n-th word lines WL1 to WLn, respectively.

Respective gates of the pipe transistors PT of the cell strings are connected to a pipeline PL.

The drain select transistor DST of each cell string is connected between the corresponding bit line and the memory cells MCp+1 to MCn. Drain select transistors DST of cell strings arranged in the row direction may be connected to drain select lines extending in the row direction. Drain select transistors of the cell strings CS11 to CS1*m* in the first row are connected to a first drain select line DSL1. Drain select transistors of the cell strings CS21 to CS2*m* in the second row are connected to a second drain select line DSL2.

Cell strings arranged in the column direction may be connected to bit lines extending in the column direction. In FIG. 4, cell strings CS11 and CS21 in a first column are connected to a first bit line BL1. Cell strings CS1*m* and CS2*m* in an m-th column are connected to an m-th bit line BLm.

Memory cells connected to the same word line in cell strings arranged in the row direction form a single page. For example, memory cells connected to the first word line WL1, among the cell strings CS11 to CS1*m* in the first row, form a single page. Memory cells connected to the first word line WL1, among the cell strings CS21 to CS2*m* in the second row, form another single page. In the case that any one of the drain select lines DSL1 and DSL2 is selected, corresponding cell strings arranged in the direction of a single row may be selected. In the case that any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number-th cell strings of the cell strings CS11 to CS1*m* or CS21 to CS2*m* arranged in the row direction may be connected to respective even bit lines. Odd-number-th cell strings of the cell strings CS11 to CS1*m* or CS21 to CS2*m* arranged in the row direction may be connected to respective odd bit lines.

In an embodiment, at least one of the first to n-th memory cells MC1 to MCn may be used as a dummy memory cell. For example, one or more dummy memory cells may be provided to reduce an electric field between the source select transistor SST and the memory cells MC1 to MCp. Alternatively, one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased.

As the number of dummy memory cells is reduced, the size of the memory block BLKa may be reduced, but the reliability in operation of the memory block BLKa may be reduced.

To efficiently control the at least one dummy memory cell, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines connected to the respective dummy memory cells.

Figure 5:
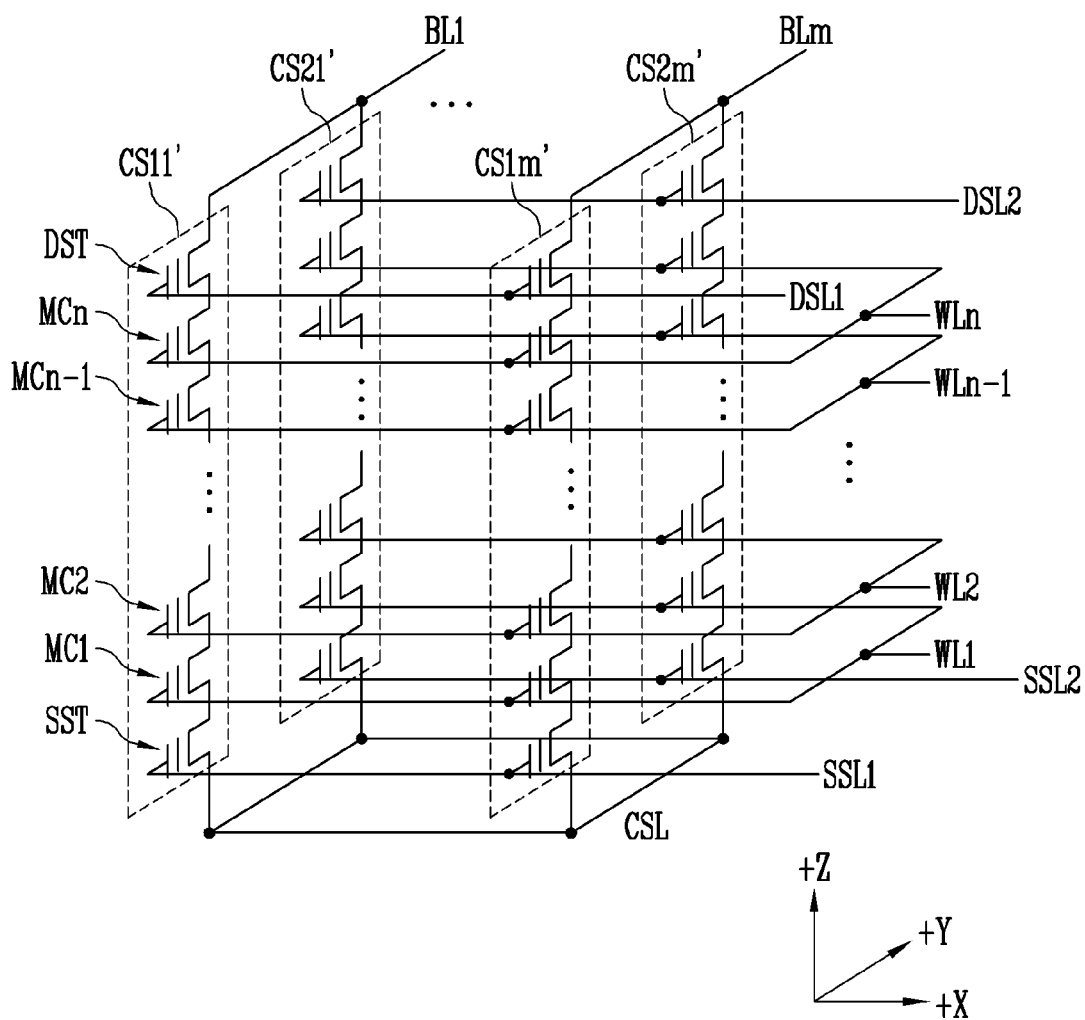
FIG. 5 is a circuit diagram illustrating any one memory block BLKb of the memory blocks BLK1 to BLKz of FIG. 3, in accordance with an embodiment of the present disclosure.

FIG. 5 is a circuit diagram illustrating any one memory block BLKb of the memory blocks BLK1 to BLKz of FIG. 3, in accordance with an embodiment of the present disclosure.

Referring to FIG. 5, the memory block BLKb may include a plurality of cell strings CS11' to CS1$m$' and CS21' to CS2$m$'. Each of the cell strings CS11' to CS1$m$' and CS21' to CS2$m$' extends in the +Z direction. Each of the cell strings CS11' to CS1$m$' and CS21' to CS2$m$' may include at least one source select transistor SST, first to n-th memory cells MC1 to MCn, and at least one drain select transistor DST which are stacked on a substrate (not shown) provided in a lower portion of the memory block BLKb.

The source select transistor SST of each cell string is connected between the common source line CSL and the memory cells MC1 to MCn. The source select transistors of cell strings arranged in the same row are connected to the same source select line. Source select transistors of the cell strings CS11' to CS1$m$' arranged in a first row may be connected to a first source select line SSL1. Source select transistors of the cell strings CS21' to CS2$m$' arranged in a second row may be connected to a second source select line SSL2. In an embodiment, source select transistors of the cell strings CS11' to CS1$m$' and CS21' to CS2$m$' may be connected in common to a single source select line.

The first to n-th memory cells MC1 to MCn in each cell string are connected in series between the source select transistor SST and the drain select transistor DST. Gates of the first to n-th memory cells MC1 to MCn are respectively connected to first to n-th word lines WL1 to WLn.

The drain select transistor DST of each cell string is connected between the corresponding bit line and the memory cells MC1 to MCn. Drain select transistors of cell strings arranged in the row direction may be connected to drain select lines extending in the row direction. Drain select transistors of the cell strings CS11' to CS1$m$' in the first row are connected to a first drain select line DSL1. Drain select transistors of the cell strings CS21' to CS2$m$' in the second row are connected to a second drain select line DSL2.

Consequently, the memory block BLKb of FIG. 5 may have a circuit similar to that of the memory block BLKa of FIG. 4 except that a pipe transistor PT is excluded from each cell string.

In an embodiment, even bit lines and odd bit lines may be provided in lieu of the first to m-th bit lines BL1 to BLm. Even-numbered cell strings among the cell strings CS11' to CS1$m$' or CS21' to CS2$m$' arranged in the row direction may be connected to the respective even bit lines, and odd-numbered cell strings among the cell strings CS11' to CS1$m$' or CS21' to CS2$m$' arranged in the row direction may be connected to the respective odd bit lines.

In an embodiment, at least one of the first to n-th memory cells MC1 to MCn may be used as a dummy memory cell.

For example, one or more dummy memory cells may be provided to reduce an electric field between the source select transistor SST and the memory cells MC1 to MCn. Alternatively, one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the at least one dummy memory cells, each of the dummy memory cells may have a required threshold voltage. Before or after an erase operation on the memory block BLKb is performed, program operations may be performed on all or some of the dummy memory cells. In the case that an erase operation is performed after a program operation has been performed, the dummy memory cells may have required threshold voltages by controlling voltages to be applied to the dummy word lines connected to the respective dummy memory cells.

Figure 6:
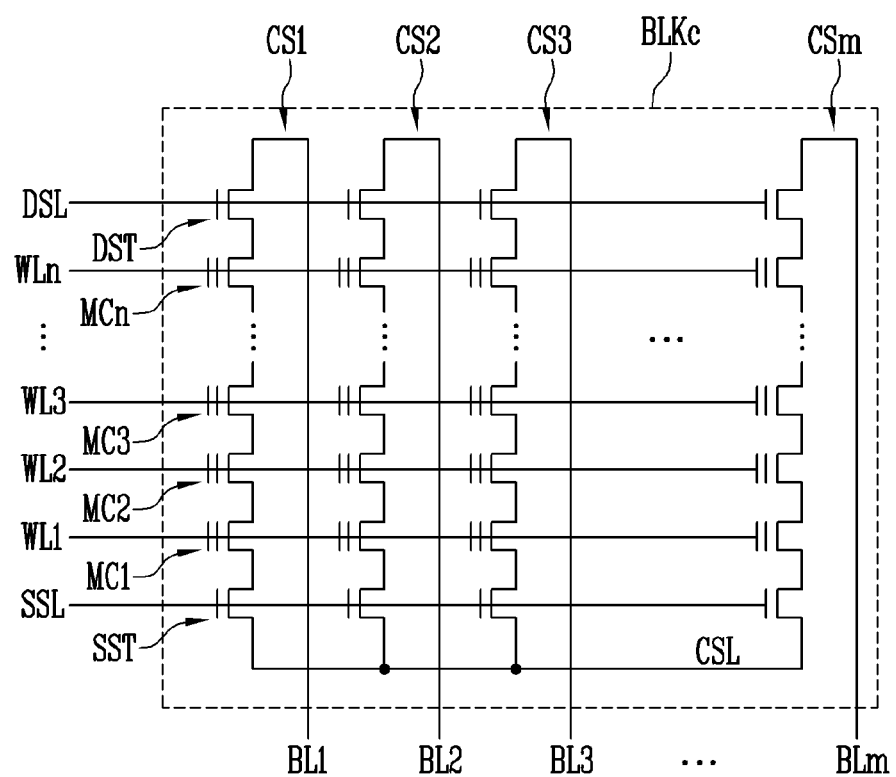
FIG. 6 is a circuit diagram illustrating any one memory block BLKc of the memory blocks BLK1 to BLKz included in the memory cell array 110 of FIG. 2, in accordance with an embodiment of the present disclosure.

FIG. 6 is a circuit diagram illustrating any one memory block BLKc of the memory blocks BLK1 to BLKz included in the memory cell array 110 of FIG. 2, in accordance with an embodiment of the present disclosure.

Referring to FIG. 6, the memory block BLKc includes a plurality of cell strings CS1 to CSm. The plurality of cell strings CS1 to CSm may be respectively connected to a plurality of bit lines BL1 to BLm. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between the common source line CSL and the memory cells MC1 to MCn.

The first to n-th memory cells MC1 to MCn in each cell string are connected between the source select transistor SST and the drain select transistor DST.

The drain select transistor DST of each cell string is connected between the corresponding bit line and the memory cells MC1 to MCn.

Memory cells connected to the same word line may form a single page. The cell strings CS1 to CSm may be selected by selecting the drain select line DSL. In the case that any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-numbered cell strings of the cell strings CS1 to CSm may be connected to the respective even bit lines, and odd-numbered cell strings may be connected to the respective odd bit lines.

Figure 7:
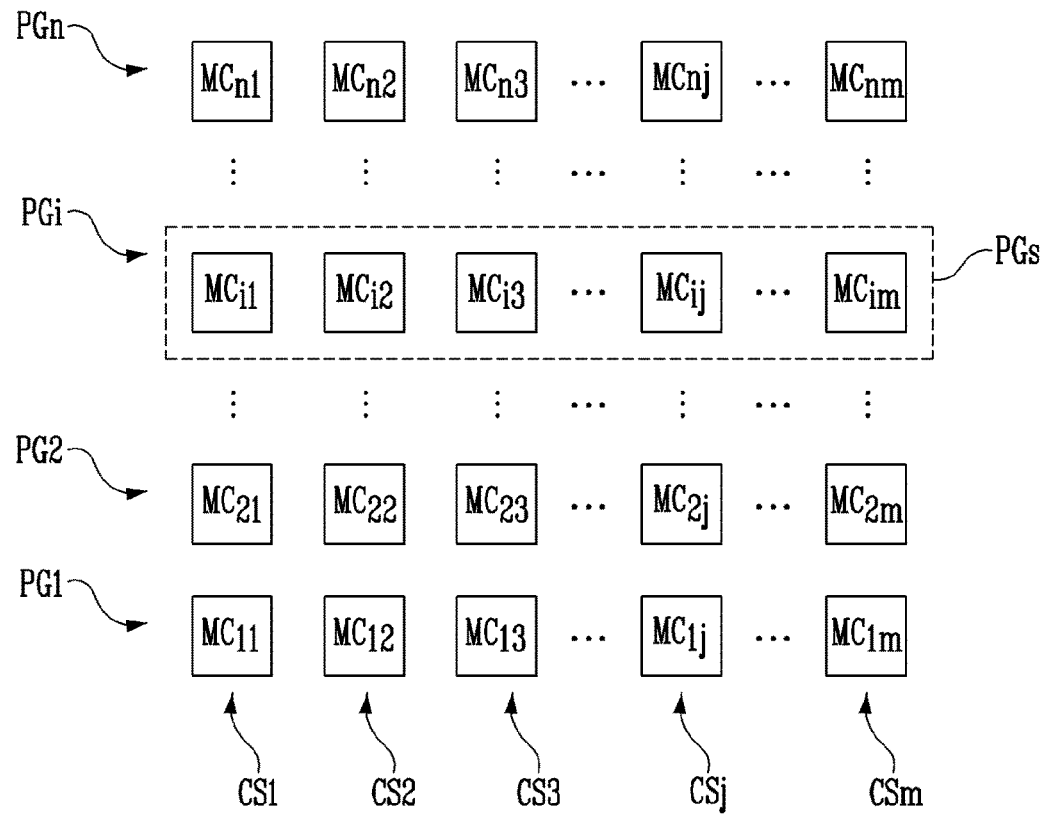
FIG. 7 is a diagram for describing a page and a cell string, which are formed of memory cells included in a memory cell array.

FIG. 7 is a diagram for describing a page and a cell string, which are formed of memory cells included in a memory cell array.

Referring to FIG. 7, the memory block includes first to m-th cell strings CS1 to CSm. The first cell string CS1 may include n memory cells $MC_{11}$ to $MC_{n1}$. The second cell string CS2 may also include n memory cells $MC_{12}$ to $MC_{n2}$. In this way, the m-th cell string CSm may include n memory cells $MC_{1m}$ to $MC_{nm}$.

The first page PG1 includes m memory cells $MC_{11}$ to $MC_{1m}$ The second page PG2 also includes m memory cells $MC_{21}$ to $MC_{2m}$. In this way, the n-th page PGn includes m memory cells $MC_{n1}$ to $MC_{nm}$.

The program operation of the semiconductor memory device 100 may be performed on a page basis. Therefore, any one page of the first to n-th pages may be selected as a target to be read. In an embodiment of FIG. 7, an i-th page PGi may be a selected page PGs that is a program target. The i-th page PGi may include first to m-th memory cells $MC_{i1}$ to $MC_{im}$.

Figure 8:
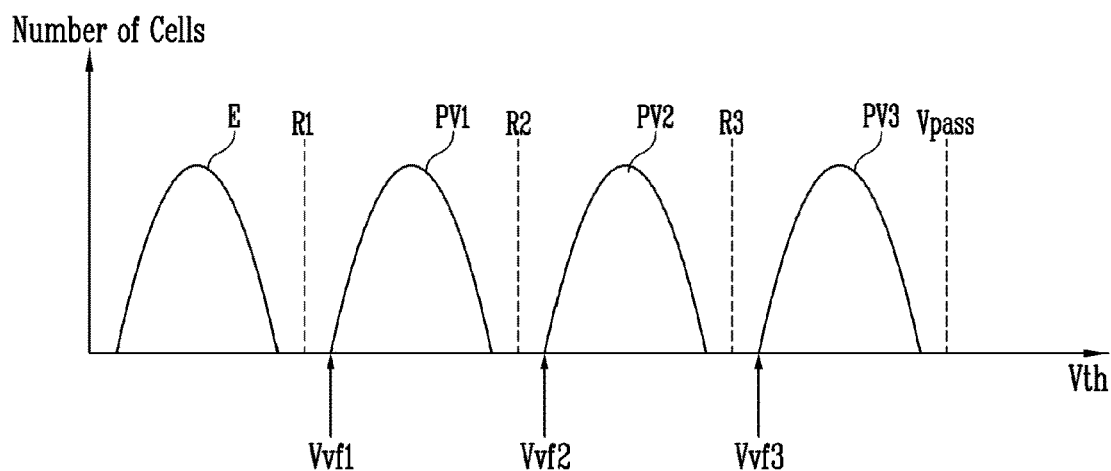
FIG. 8 is a graph illustrating a threshold voltage distribution of multi-level cells (MLCs).

FIG. 8 is a graph illustrating a threshold voltage distribution of a multi-level cell (MLC).

Particularly, FIG. 8 illustrates a threshold voltage distribution immediately after a program operation on a selected page PGs has been completed. Each of the multi-level cells configured to store two bits of data in each memory cell may be programmed to any one state of four states depending on bit data to be stored. In other words, a threshold voltage of each of the multi-level cells may belong to an erased state E, a first programmed state PV1, a second programmed state PV2, and a third programmed state PV3.

During a program operation, a verify voltage for verifying whether each of the memory cells has been appropriately programmed to a target programmed state may be used. In more detail, a first verify voltage Vvf1 may be used to verify a threshold voltage of each of the memory cells to be programmed to the first programmed state PV1. Furthermore, a second verify voltage Vvf2 may be used to verify a threshold voltage of each of the memory cells to be programmed to the second programmed state PV2. Lastly, a third verify voltage Vvf3 may be used to verify a threshold voltage of each of the memory cells to be programmed to the third programmed state PV3.

A read operation may be performed to read data stored in memory cells. In this case, a first read voltage R1, a second read voltage R2, and a third read voltage R3 may be used to read data programmed in memory cells included in a selected page.

Hereinafter, embodiments of the present disclosure will be described based on a multi-level cell, which may store two bits of data in each memory cell. However, the present disclosure is not applied to only the multi-level cell, and may also be applied to a triple-level cell (TLC), a quad-level cell (QLC), etc. In addition, the present disclosure may be applied to a semiconductor memory device including memory cells that apply two or more bits. In a case in which N bits are stored in each memory cell, a threshold voltage distribution of corresponding cells may belong to any one of an erased state and a first to $2^N-1$-th programmed states. In this case, first to $2^N-1$-th read voltages may be used to read data stored in a memory cell. Furthermore, first to $2^N-1$-th verify voltages may be used to program a memory cell for storing N bits.

Figure 9:
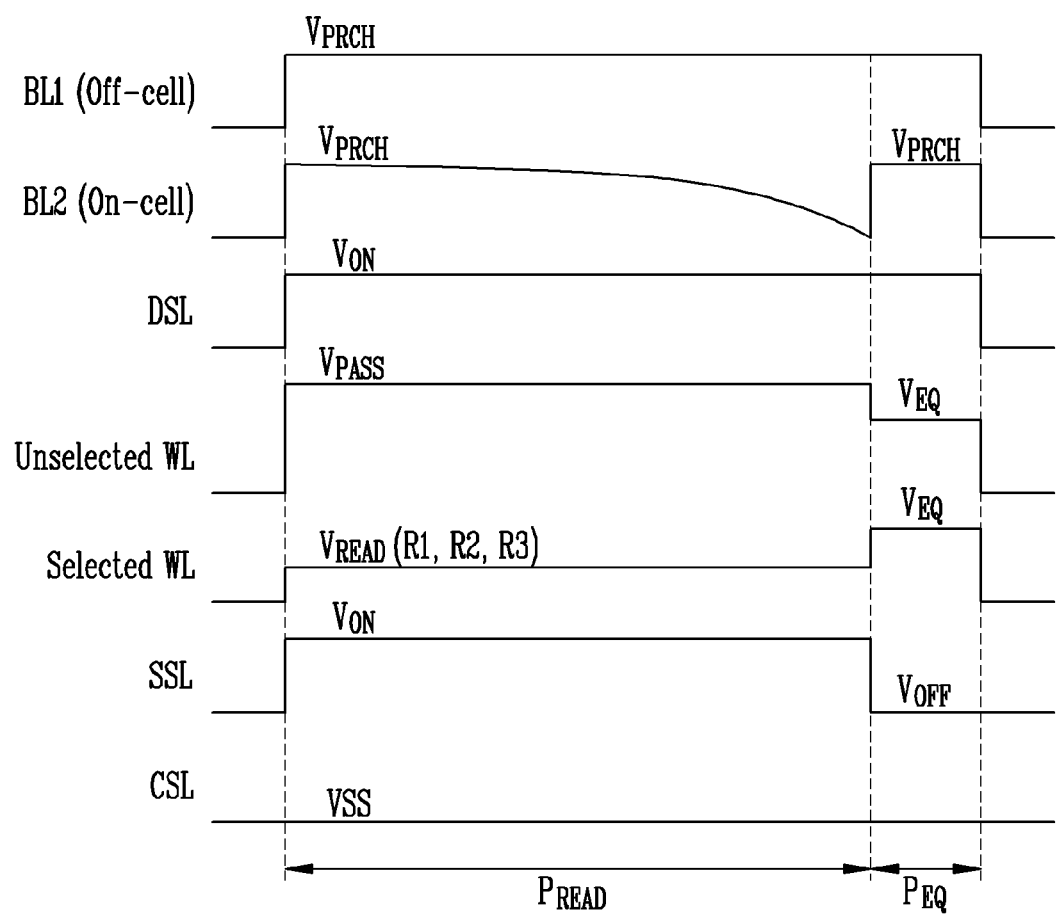
FIG. 9 is a timing diagram for illustratively describing a method of operating the semiconductor memory device in accordance with an embodiment of the present disclosure.

FIG. 9 is a timing diagram for illustratively describing a method of operating a semiconductor memory device in accordance with an embodiment of the present disclosure.

Referring to FIG. 9, in accordance with an embodiment of the present disclosure, there is shown a timing diagram illustrating a method operating the semiconductor memory device to read data stored in selected memory cells. As illustrated in FIG. 9, a timing diagram for embodying a read operation of a semiconductor memory device may include a read period $P_{READ}$ and an equalizing period $P_{EQ}$. In more detail, FIG. 9 illustrates a timing diagram pertaining to voltages of bit lines BL1 and BL2, a drain select line DSL, an unselected word line Unselected WL, a selected word line Selected WL, a source select line SSL, and a common source line CSL during the read period $P_{READ}$ and the equalizing period $P_{EQ}$. FIG. 9 illustrates an example in which an off-cell of memory cells selected as a target to be read is connected to the first bit line BL1 and an on-cell is connected to the second bit line BL2.

During the read period $P_{READ}$, the bit lines BL1 and BL2 may be precharged. Hence, the voltages of the bit lines BL1 and BL2 may increase to a precharge voltage $V_{PRCH}$. During the read period $P_{READ}$, a turn-on voltage $V_{ON}$ may be applied to the drain select line DSL and the source select line SSL. A ground voltage VSS may be applied to the common source line CSL.

A pass voltage $V_{PASS}$ may be applied to an unselected word line of the word lines, and a read voltage $V_{READ}$ may be applied to a selected word line. The read voltage $V_{READ}$ may be less than the pass voltage $V_{PASS}$. Hence, data stored in memory cells connected to the selected word line may be read. The read voltage $V_{READ}$ may be any one of the first to third read voltages R1 to R3 shown in FIG. 8.

For example, because a cell string connected to the bit line BL1 includes the off-cell, the precharge voltage $V_{PRCH}$ applied at an initial stage of the read period P READ may be retained. Because a cell string connected to the bit line BL2 includes the on-cell, the precharge voltage $V_{PRCH}$ applied at the initial stage of the read period P READ may decrease. As such, depending on whether the precharge voltage $V_{PRCH}$ has decreased, it may be determined whether data has been stored in a connected memory cell.

After the read period $P_{READ}$ has been completed, a turn-on voltage $V_{ON}$ may be applied to the drain select line DSL and a turn-off voltage $V_{OFF}$ may be applied to the source select line SSL during the equalizing period $P_{EQ}$. Furthermore, a boosting prevention voltage may be applied to the bit lines BL1 and BL2 during the equalizing period $P_{EQ}$. In the embodiment of FIG. 9, the precharge voltage $V_{PRCH}$ may be used as the boosting prevention voltage.

During the equalizing period $P_{EQ}$, an equalizing voltage $V_{EQ}$ may be applied to the unselected word line and the selected word line. In an embodiment, as illustrated in FIG. 9, the equalizing voltage $V_{EQ}$ may be a voltage greater than the read voltage $V_{READ}$ and less than the pass voltage $V_{PASS}$. In an embodiment, the equalizing voltage $V_{EQ}$ may be a voltage having a level identical to that of the pass voltage $V_{PASS}$.

As illustrated in FIG. 9, because, during the equalizing period $P_{EQ}$, the turn-on voltage $V_{ON}$ is applied to the drain select line DSL and the turn-off voltage $V_{OFF}$ is applied to the source select line SSL, the drain select transistor DST may be turned on, and the source select transistor SST may be turned off. Furthermore, as the boosting prevention voltage is applied to the bit lines BL1 and BL2 during the equalizing period $P_{EQ}$, the boosting prevention voltage may be transmitted to the channel area of the cell string through the drain select transistor DST. Because the boosting prevention voltage is transmitted to the channel area in the cell string, a phenomenon in which a channel voltage of the cell string is negatively boosted may be minimized even though the equalizing voltage $V_{EQ}$ is applied to the word lines WL1 to WLn and thereafter the equalizing voltage $V_{EQ}$ of the word lines is discharged. Therefore, at a recovery step, a positive boosting phenomenon which occurs on a word line may be minimized. Consequently, a shift width of a threshold voltage distribution of memory cells may be minimized, so that an effect of read disturb may be reduced.

In accordance with the timing diagram shown in FIG. 9, a difference in threshold voltage between the erased state E and the third programmed state PV3 that is the last programmed state may be relatively great. In this case, Z-interference of erase cells due to threshold voltage variation of memory cells connected to an unselected word line adjacent to a selected word line to which the read voltage $V_{READ}$ is applied may be increased. Hence, the probability of an occurrence of a read failure during a read operation using a first read voltage R1 may be increased.

In an embodiment of the present disclosure, a relatively high read pass voltage may be applied to an unselected word line adjacent to the selected word line during the read operation using the first read voltage R1. Furthermore, in an embodiment of the present disclosure, a relatively low precharge voltage may be applied to bit lines connected to selected memory cells during the read operation using the first read voltage R1. In an embodiment of the present disclosure, a relatively low verify pass voltage may be applied to an unselected word line adjacent to a selected word line during a verify operation using a first verify voltage Vvf1.

Thereby, during the read operation or the verify operation, channel potential variation attributable to a threshold voltage increase of memory cells connected to unselected word lines disposed adjacent to a selected word line may be reduced. Hence, during the read operation, Z-interference which acts in a cell string direction may be reduced, so that the probability of an occurrence of a read failure may be reduced.

Figure 10:
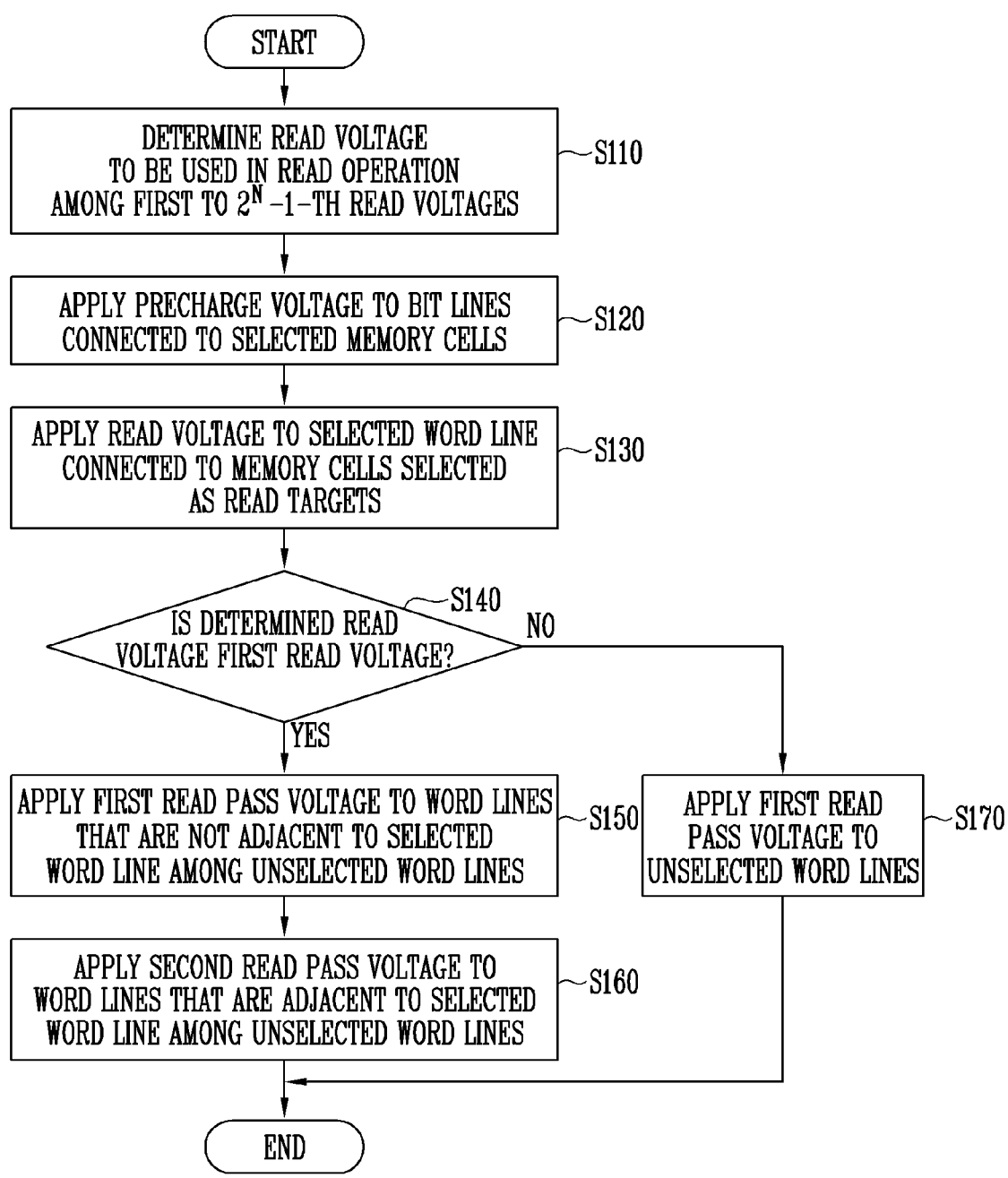
FIG. 10 is a flowchart illustrating a method of operating the semiconductor memory device in accordance with an embodiment of the present disclosure.
Figure 11:
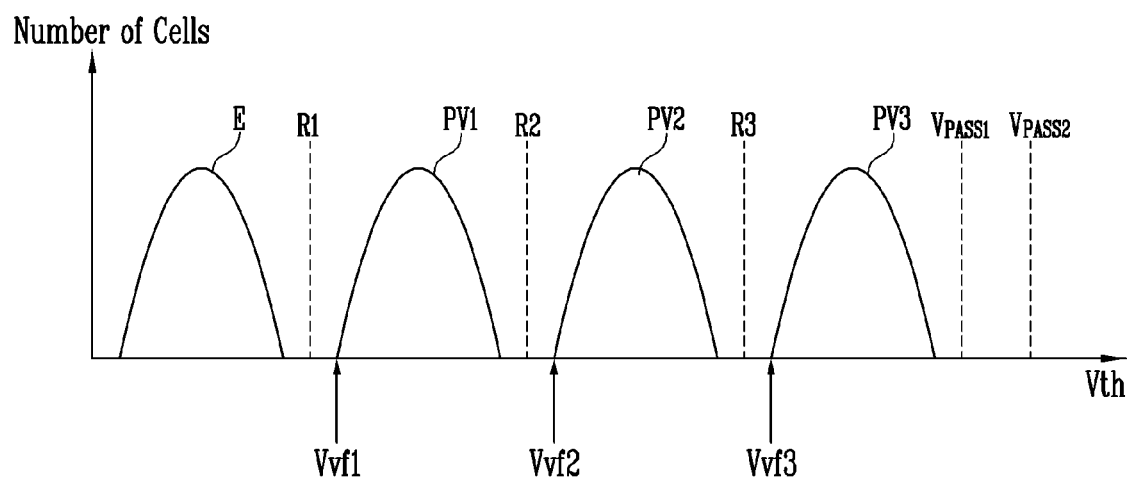
FIG. 11 is a graph for describing first and second read pass voltages in accordance with an embodiment of the present disclosure.
Figure 12A:
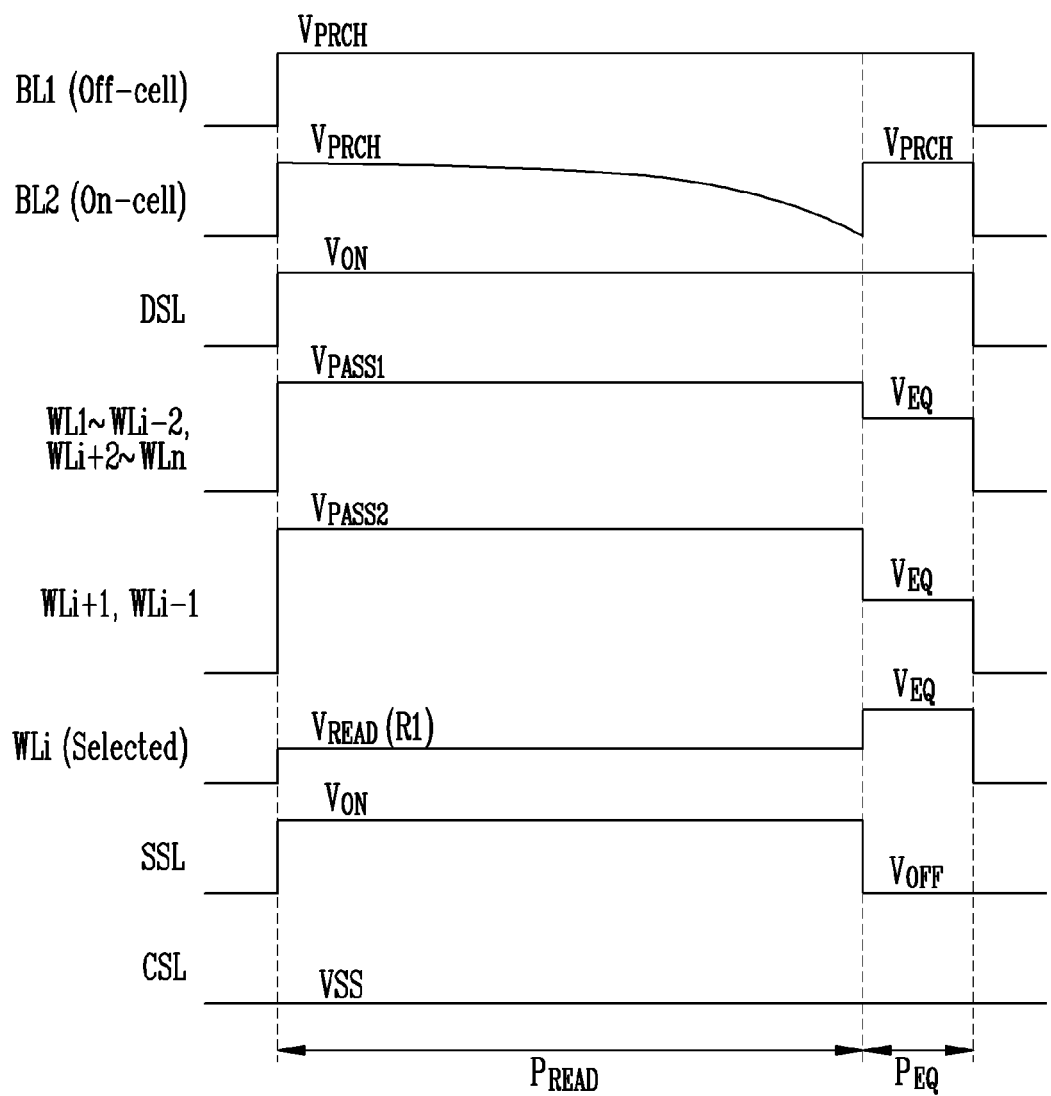
FIGS. 12A and 12B are timing diagrams for describing the method of operating the semiconductor memory device according to FIG. 10.
Figure 12B:
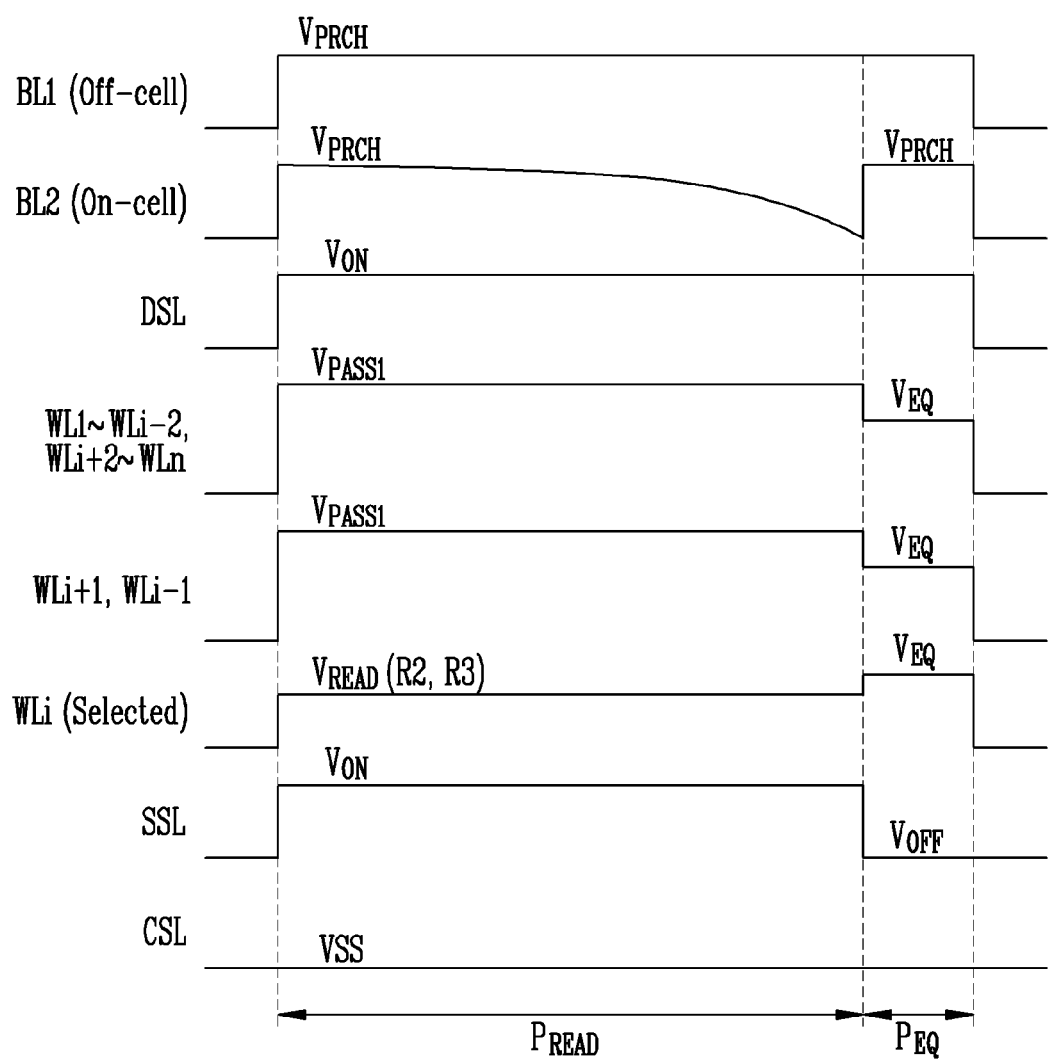

FIG. 10 is a flowchart illustrating a method of operating the semiconductor memory device in accordance with an embodiment of the present disclosure. FIG. 11 is a graph for describing first and second read pass voltages in accordance with an embodiment of the present disclosure. FIGS. 12A and 12B are timing diagrams for describing a method of operating the semiconductor memory device according to FIG. 10. Particularly, FIG. 12A is a timing diagram illustrating a read operation using a first read voltage R1, and FIG. 12B is a timing diagram illustrating a read operation using a second read voltage R2 or a third read voltage R3.

Hereinafter, the method of operating the semiconductor memory device in accordance with an embodiment of the present disclosure will be described with reference to FIGS. 10, 11, 12A, and 12B.

Referring to FIG. 10, in the method of operating the semiconductor memory device in accordance with the embodiment of the present disclosure, data stored in selected memory cells may be read. In more detail, the method of operating the semiconductor memory device may include step S110 of determining a read voltage to be used in a read operation among first to $2^N-1$-th read voltages, step S120 of applying a precharge voltage to bit lines connected to selected memory cells, step S130 of applying a read voltage to a word line connected to the memory cells selected as read targets, and step S140 of determining whether a determined read voltage is a first read voltage. In accordance with an embodiment, the method of operating the semiconductor memory device my further include, when it is determined that the read voltage is a first read voltage (YES at S140), step S150 of applying a first read pass voltage to word lines that are not adjacent to the selected word line, among unselected word lines, and step S160 of applying a second read pass voltage to word lines adjacent to the selected word line among the unselected word lines. In an embodiment, the method of operating the semiconductor memory device may further include step S170 of applying a first read pass voltage to the unselected word lines when it is determined that the read voltage is not the first read voltage (NO at S140).

At step S110, a read voltage to be used in the read operation among the first to $2^N-1$-th read voltages may be determined. The variable N may represent a natural number equal to or greater than 2. For the case shown in FIG. 8, the memory cells are MLCs, an N may be 2. In this case, at step S110, a read voltage to be used in the read operation among the first to third read voltages may be determined. In an embodiment, in a case for which the memory cells are TLCs, N may be 3. In this case, at step S110, a read voltage to be used in the read operation among the first to seventh read voltages may be determined. Hereinafter, it will be assumed the memory cells are MLCs.

At step S120, a precharge voltage may be applied to bit lines connected to the memory cells selected as targets of the read operation. Referring to FIGS. 12A and 12B, during the read period $P_{READ}$, the bit lines BL1 and BL2 may be precharged. Hence, the voltages of the bit lines BL1 and BL2 may increase to a precharge voltage $V_{PRCH}$.

Thereafter, at step S130, a read voltage may be applied to the word line connected to the memory cells selected as the read targets. Referring to FIG. 12A, a first read voltage R1 may be applied to a selected word line WLi that is a word line connected to the selected memory cells. Referring to FIG. 12B, a second read voltage R2 or a third read voltage R3 may be applied to the selected word line WLi that is a word line connected to the selected memory cells.

At step S140, it may be determined whether the determined read voltage is the first read voltage. When it is determined that the read voltage is the first read voltage R1 (YES at S140), the read operation may be performed according to the timing diagram shown in FIG. 12A.

When it is determined that the determined read voltage is the first read voltage (YES at S140), the process proceeds to step S150, so that a first read pass voltage $V_{PASS1}$ may be applied to word lines WL1 to WLi−2 and WLi+2 to WLn that are not adjacent to the selected word line WLi among unselected word lines WL1 to WLi−1 and WLi+1 to WLn. Furthermore, at step S160, a second read pass voltage $V_{PASS2}$ may be applied to the word lines WLi−1 and WLi+1 that are adjacent to the selected word line WLi among the unselected word lines WL1 to WLi−1 and WLi+1 to WLn.

In other words, when the read voltage to be used in the read operation is the first read voltage R1, different read pass voltages may be applied to the word lines (referred also to as "nonadjacent word lines") WL1 to WLi−2 and WLi+2 to WLn that are not adjacent to the selected word line WLi among the unselected word lines WL1 to WLi−1 and WLi+1 to WLn, and the word lines (referred also to as "adjacent word lines") WLi−1 and WLi+1 that are adjacent to the selected word line WLi.

FIG. 11 illustrates a threshold voltage distribution of multi-level cells (MLC), the first read pass voltage $V_{PASS1}$ and the second read pass voltage $V_{PASS2}$ As illustrated in FIG. 11, the second read pass voltage $V_{PASS2}$ may be greater than the first read pass voltage $V_{PASS1}$. In other words, when the read voltage to be used in the read operation is the first read voltage R1, the first read pass voltage $V_{PASS1}$ which is relatively low may be applied to the nonadjacent word lines WL1 to WLi−2 and WLi+2 to WLn, and the second read pass voltage $V_{PASS2}$ which is relatively high may be applied to the adjacent word lines WLi−1 and WLi+1. Thereby, during the read operation using the first read voltage R1, channel potential variation attributable to a threshold voltage increase of memory cells connected to unselected word lines disposed adjacent to a selected word line may be reduced. Hence, during the read operation, Z-interference which acts in a cell string direction may be reduced, so that the probability of an occurrence of a read failure may be reduced.

In the case that the determined read voltage is not the first read voltage R1 (NO at S140), the first read pass voltage $V_{PASS1}$ may be applied to the unselected word lines WL1 to WLi−1 and WLi+1 to WLn, at step S170. As illustrated in FIG. 12B, during the read operation using the second read voltage R2 or the third read voltage R3, the first read pass voltage $V_{PASS1}$ may be applied to both the adjacent word lines WLi−1 and WLi+1 and the nonadjacent word lines WL1 to WLi−2 and WLi+2 to WLn.

Figure 13:
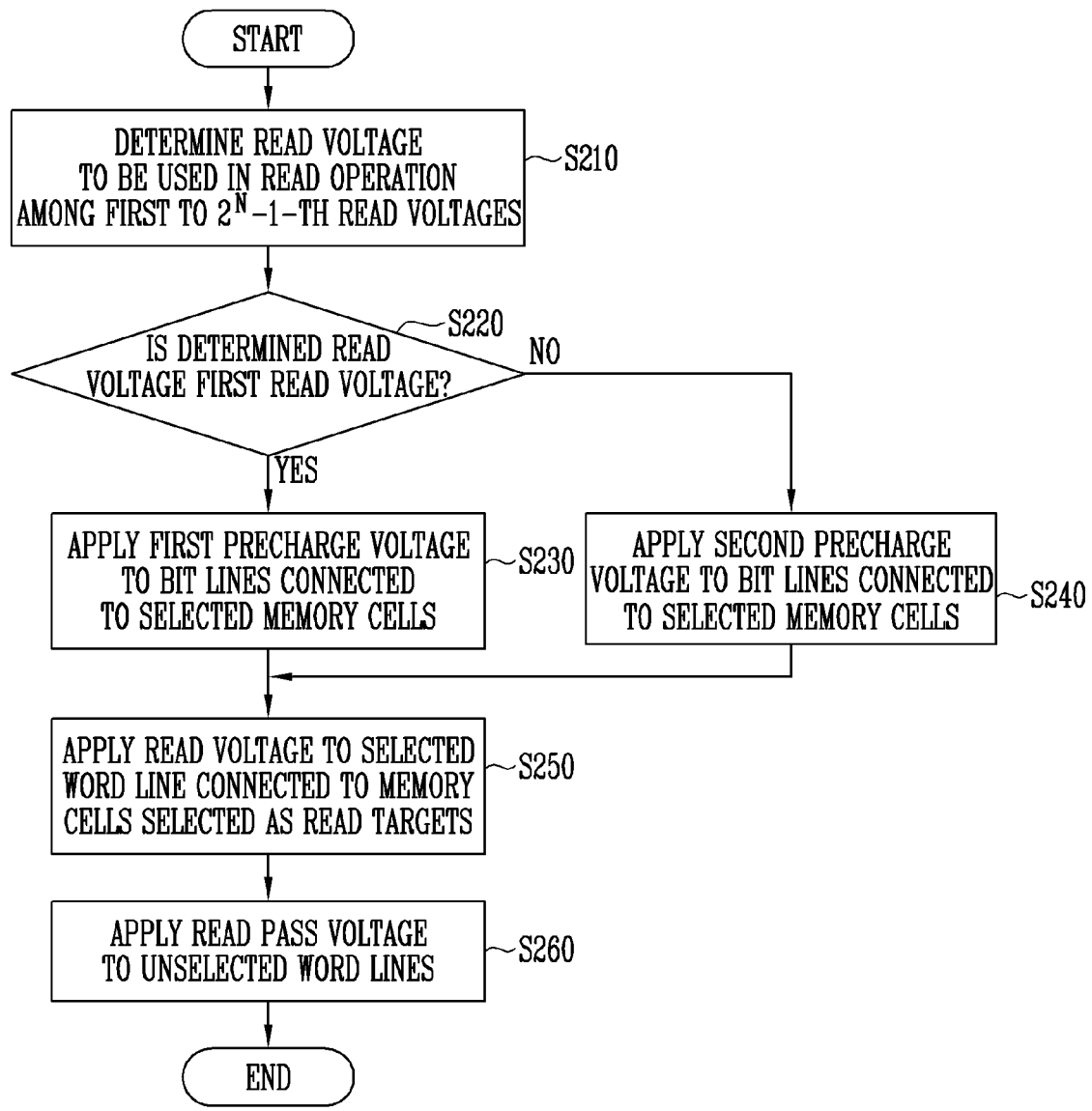
FIG. 13 is a flowchart illustrating a method of operating the semiconductor memory device in accordance with an embodiment of the present disclosure.
Figure 14A:
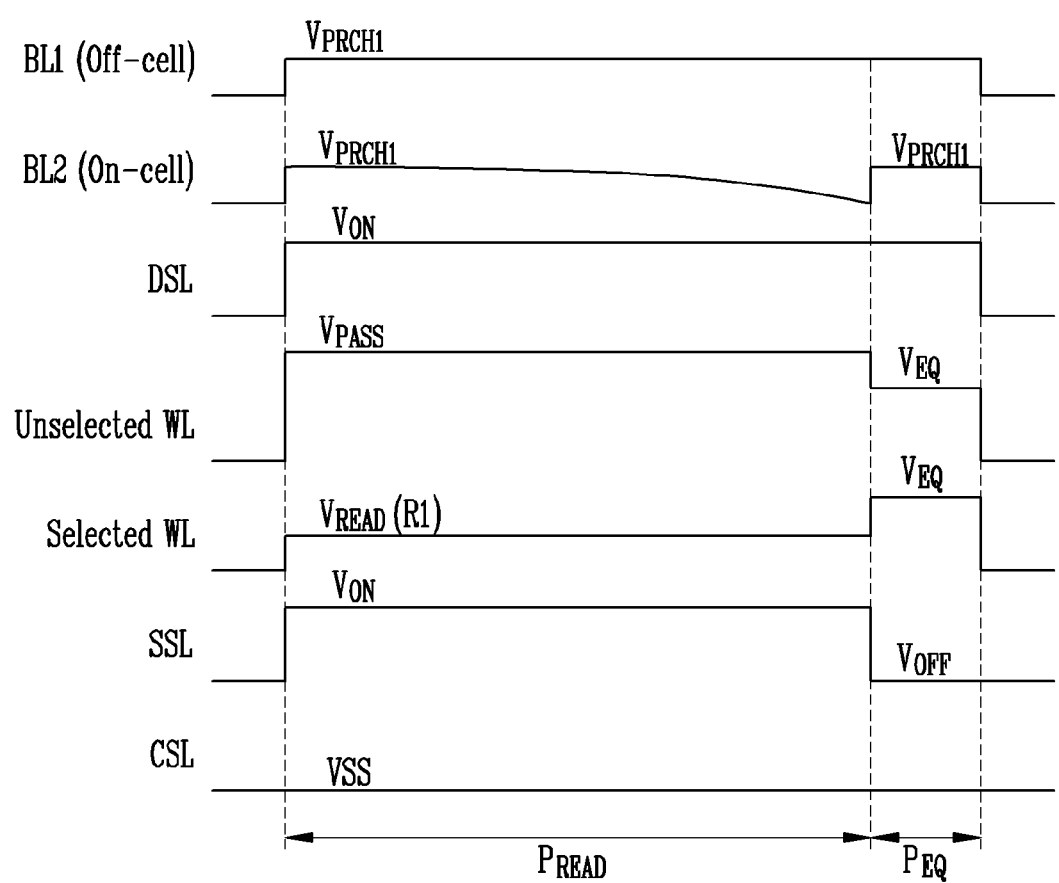
FIGS. 14A and 14B are timing diagrams for describing the method of operating the semiconductor memory device according to FIG. 13.
Figure 14B:
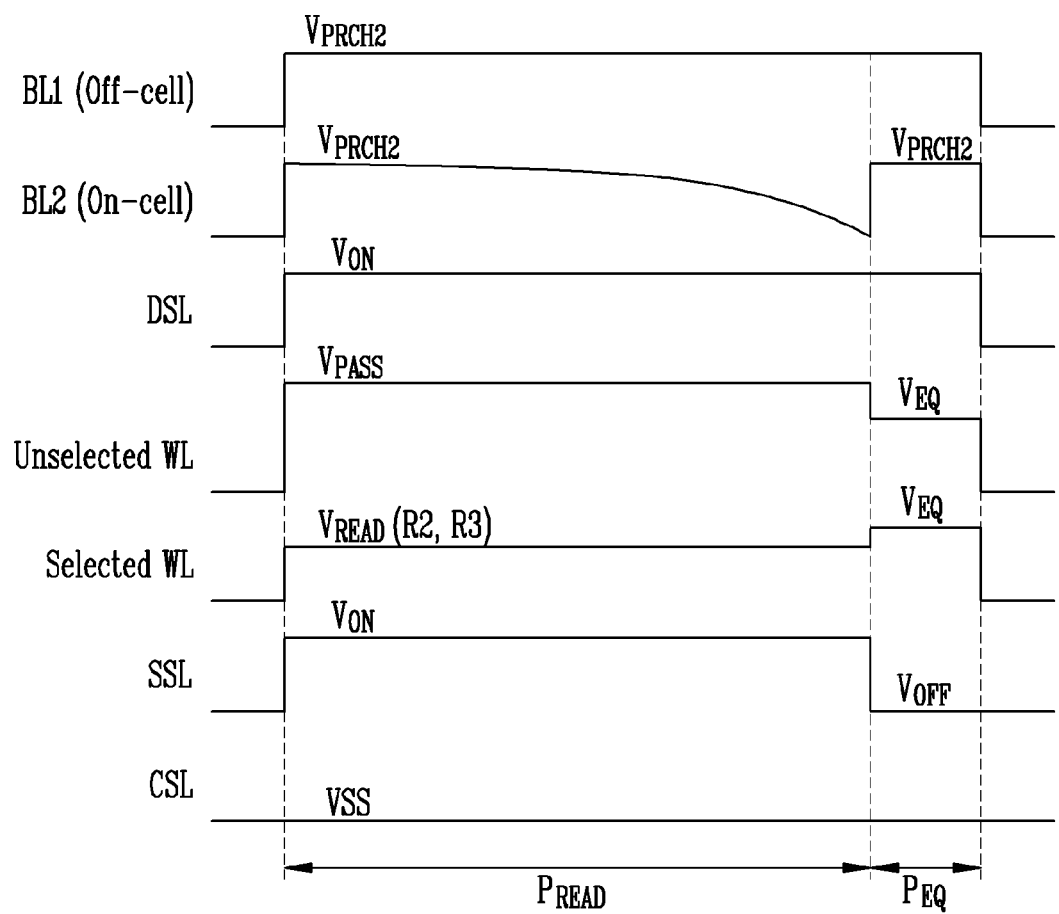

FIG. 13 is a flowchart illustrating a method of operating the semiconductor memory device in accordance with an embodiment of the present disclosure. FIGS. 14A and 14B are timing diagrams for describing the method of operating the semiconductor memory device according to FIG. 13. Hereinafter, the method of operating the semiconductor memory device will be described with reference to FIGS. 13, 14A, and 14B.

Referring to FIG. 13, in the method of operating the semiconductor memory device, data stored in selected memory cells may be read. In more detail, the method may include step S210 of determining a read voltage to be used in a read operation among the first to $2^N$−1-th read voltages, and step S220 of determining whether the determined read voltage is a first read voltage. In an embodiment, the method of operating the semiconductor memory device may further include step S230 of applying a first precharge voltage to bit lines connected to selected memory cells when the determined read voltage is the first read voltage (YES at S220). In an embodiment, the method of operating the semiconductor memory device may further include step S240 of applying a second precharge voltage to the bit lines connected to the selected memory cells when the determined read voltage is not the first read voltage (NO at S220). The method of operating the semiconductor memory device may further include step S250 of applying a read voltage to a word line connected to the memory cells selected as read targets, and step S260 of applying a read pass voltage to unselected word lines.

At step S210, a read voltage to be used in the read operation among the first to $2^N$−1-th read voltages is determined. The variable N represents a natural number equal to or greater than 2. Hereinafter, description will be focused on the case where the memory cells are MLCs.

At step S220, it may be determined whether the determined read voltage is the first read voltage. When it is determined that the read voltage is the first read voltage R1 (YES at S220), the read operation may be performed according to the timing diagram shown in FIG. 14A.

In the case that the determined read voltage is the first read voltage (YES at S220), a first precharge voltage $V_{PRCH1}$ may be applied to bit lines connected to memory cells selected at step S230. As shown in FIG. 14A, during the read period $P_{READ}$, the bit lines BL1 and BL2 may be precharged. Hence, the voltages of the bit lines BL1 and BL2 may increase to the first precharge voltage $V_{PRCH1}$.

Thereafter, at step S250, a read voltage may be applied to the word line connected to the memory cells selected as the read targets. Referring to FIG. 14A, a first read voltage R1 may be applied to a selected word line that is a word line connected to the selected memory cells.

At step S260, a read pass voltage $V_{PASS}$ may be applied to unselected word lines regardless of whether the unselected word lines are adjacent to the selected word line.

In the case that the determined read voltage is not the first read voltage R1 (NO at S220), the read operation may be performed according to the timing diagram shown in FIG. 14B.

In the case that the determined read voltage is not the first read voltage (NO at S220), a second precharge voltage may be applied to the bit lines connected to the memory cells selected at step S240. As shown in FIG. 14B, during the read period $P_{READ}$, the bit lines BL1 and BL2 may be precharged. Hence, the voltages of the bit lines BL1 and BL2 may increase to the second precharge voltage $V_{PRCH2}$.

Referring to FIGS. 14A and 14B, the second precharge voltage $V_{PRCH2}$ may be greater than the first precharge voltage $V_{PRCH1}$. In other words, in the case that the read voltage to be used in the read operation is the first read voltage R1, the first precharge voltage $V_{PRCH1}$ which is relatively low may be used to perform a precharge operation. In the case that the read voltage to be used in the read operation is not the first read voltage R1, the second precharge voltage $V_{PRCH2}$ which is relatively high may be used to perform the precharge operation. Thereby, during the read operation using the first read voltage R1, channel potential variation attributable to a threshold voltage increase of memory cells connected to unselected word lines disposed adjacent to a selected word line may be reduced. Hence, during the read operation, Z-interference which acts in a cell string direction may be reduced, so that the probability of an occurrence of a read failure may be reduced.

Figure 15:
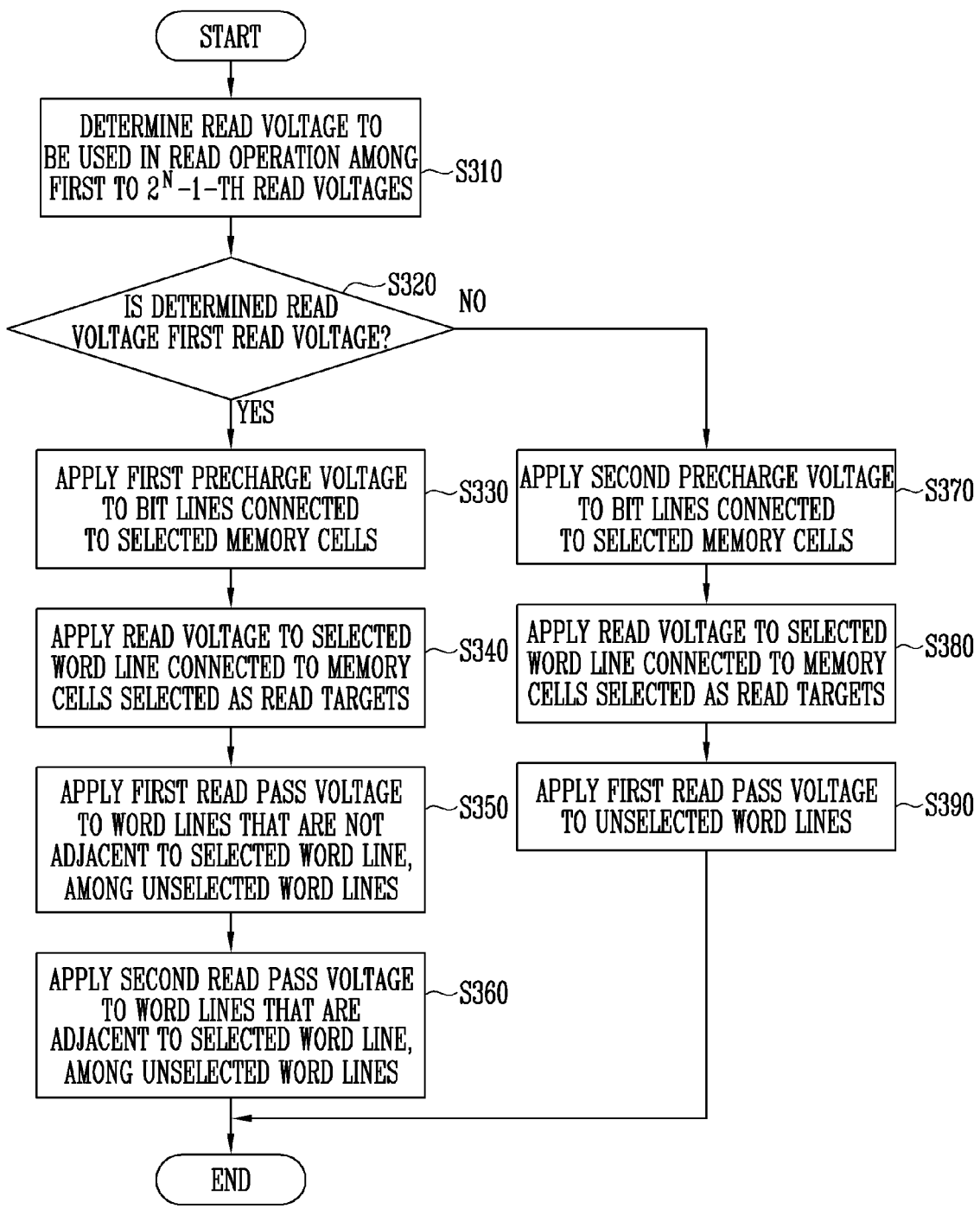
FIG. 15 is a flowchart illustrating a method of operating the semiconductor memory device in accordance with an embodiment of the present disclosure.
Figure 16A:
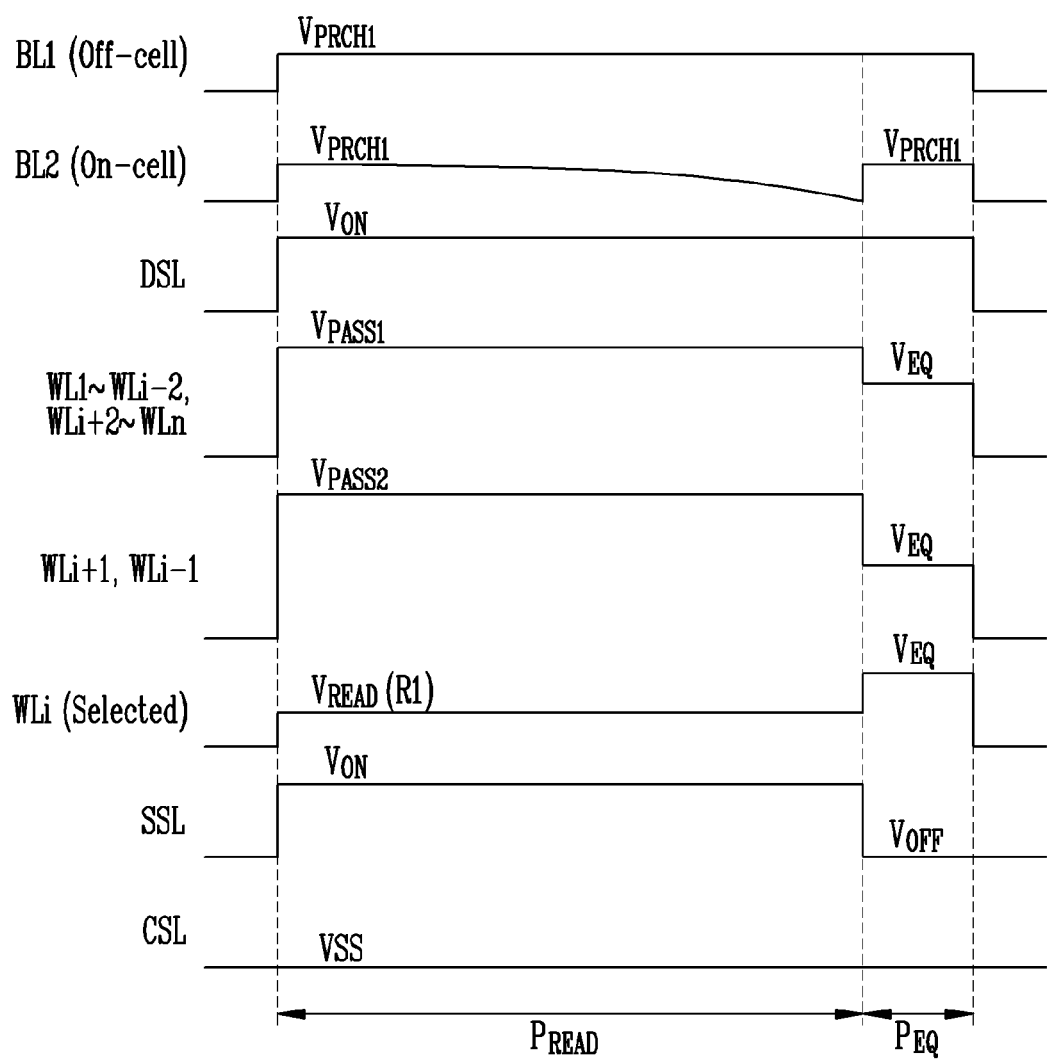
FIGS. 16A and 16B are timing diagrams for describing the method of operating the semiconductor memory device according to FIG. 15.
Figure 16B:
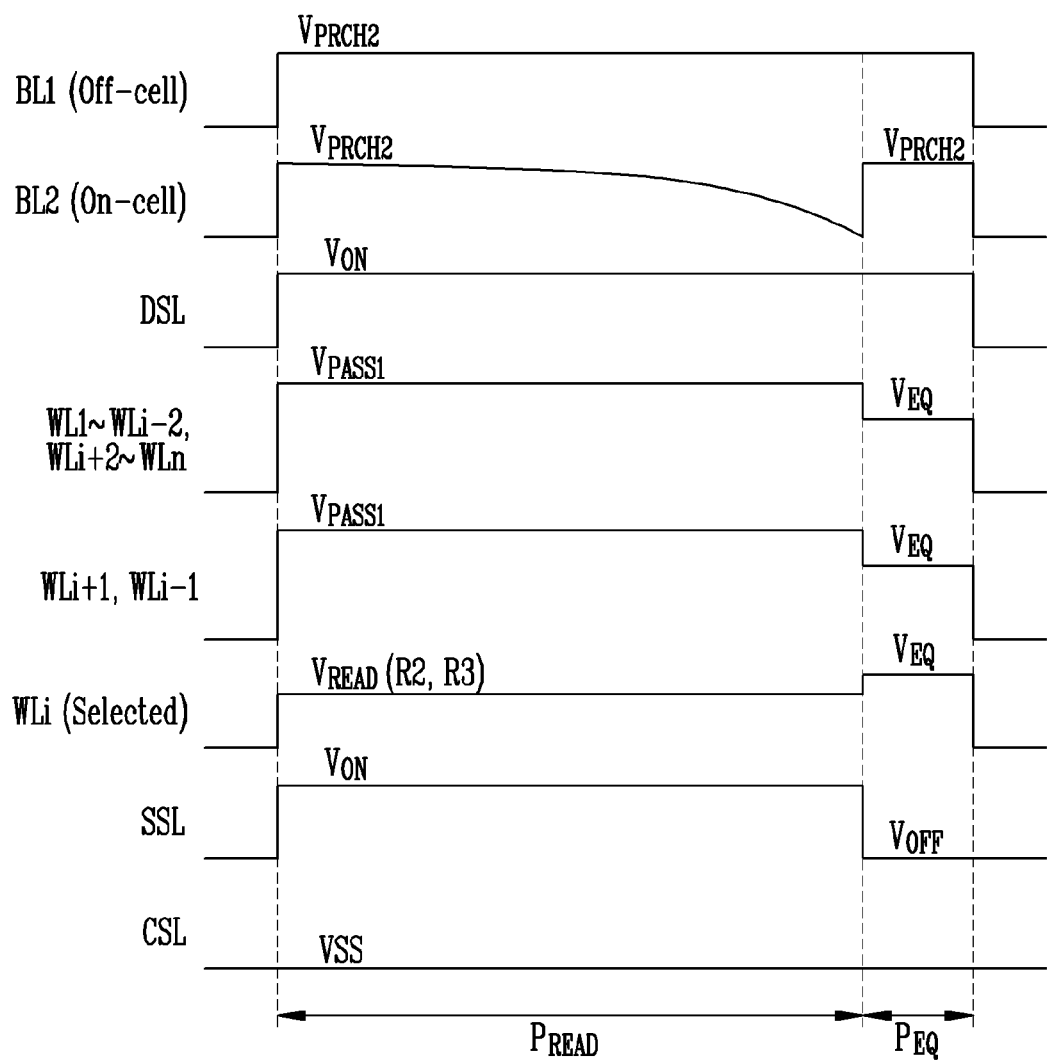

FIG. 15 is a flowchart illustrating a method of operating the semiconductor memory device in accordance with an embodiment of the present disclosure. FIGS. 16A and 16B are timing diagrams for describing the method of operating the semiconductor memory device according to FIG. 15. Hereinafter, the method of operating the semiconductor memory device in accordance with an embodiment of the present disclosure will be described with reference to FIGS. 15, 16A, and 16B.

Referring to FIG. 15, in the method of operating the semiconductor memory device, data stored in selected memory cells may be read. In more detail, the method may include step S310 of determining a read voltage to be used in a read operation among the first to $2^N$−1-th read voltages, and step S320 of determining whether the determined read voltage is a first read voltage.

In an embodiment, the method of operating the semiconductor memory device in accordance with the embodiment of the present disclosure may further include, in the case that the determined read voltage is the first read voltage R1 (YES at S320), step S330 of applying a first precharge voltage to bit lines connected to selected memory cells, step S340 of applying a read voltage to a selected word line connected to the memory cells selected as read targets, step S350 of applying a first read pass voltage to word lines that are not adjacent to the selected word line among unselected word lines, and step S360 of applying a second read pass voltage to word lines that are adjacent to the selected word line among the unselected word lines.

In an embodiment, the method of operating the semiconductor memory device in accordance with the embodiment of the present disclosure may further include, in the case that the determined read voltage is not the first read voltage (NO at S320), step S370 of applying a second precharge voltage to the bit lines connected to the selected memory cells, step S380 of applying a read voltage to the selected word line connected to the memory cells selected as the read targets, and step S390 of applying a first read pass voltage to the unselected word lines.

It may be understood that the embodiment of FIG. 15 is implemented as a combination of the embodiment of FIG. 10 and the embodiment of FIG. 13. In the case that a read voltage to be used in the read operation is the first read voltage (YES at S320), the read operation may be performed according to the timing diagram of FIG. 16A. In this case, a first precharge voltage $V_{PRCH1}$ which is relatively low may be applied to the bit lines connected to the selected memory cells (step S330), and a first read pass voltage $V_{PASS1}$ may be applied to word lines WL1 to WLi−2 and WLi+2 to WLn that are not adjacent to a selected word line WLi among unselected word lines WL1 to WLi−1 and WLi+1 to WLn (step S350). Furthermore, a second read pass voltage $V_{PASS2}$ may be applied to the word lines WLi−1 and WLi+1 that are adjacent to the selected word line WLi among the unselected word lines WL1 to WLi−1 and WLi+1 to WLn (step S360).

In other words, in the case that the read voltage to be used in the read operation is the first read voltage R1, the first precharge voltage $V_{PRCH1}$ which is relatively low may be used to perform a precharge operation. Furthermore, different read pass voltages may be applied to the word lines (referred also to as "nonadjacent word lines") WL1 to WLi−2 and WLi+2 to WLn that are not adjacent to the selected word line WLi among the unselected word lines WL1 to WLi−1 and WLi+1 to WLn, and the word lines (referred also to as "adjacent word lines") WLi−1 and WLi+1 that are adjacent to the selected word line WLi.

In the case that the read voltage to be used in the read operation is not the first read voltage (NO at S320), the read operation may be performed according to the timing diagram of FIG. 16B. In this case, the second precharge voltage $V_{PRCH2}$ which is relatively large may be applied to the bit lines connected to the selected memory cells (at step S370), and the second read pass voltage $V_{PASS2}$ may be applied to the unselected word lines WL1 to WLi−1 and WLi+1 to WLn (at step S390).

In other words, in the case that the read voltage to be used in the read operation is not the first read voltage R1, the second precharge voltage $V_{PRCH2}$ which is relatively high may be used to perform a precharge operation. Furthermore, an identical read pass voltage may be applied to the unselected word lines WL1 to WLi−1 and WLi+1 to WLn.

Figure 17:
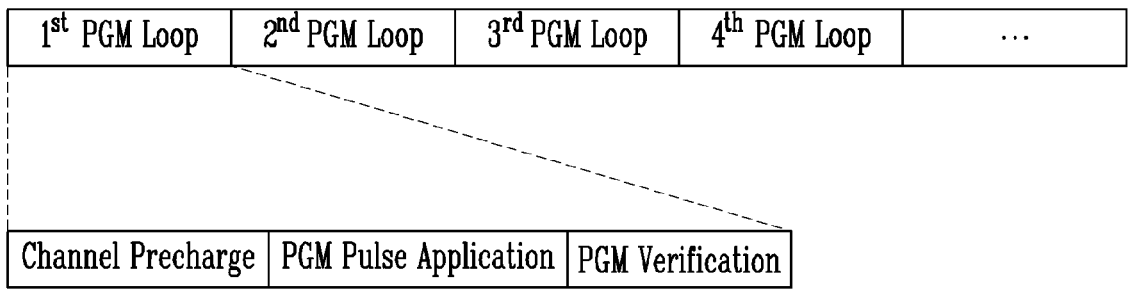
FIG. 17 is a diagram for describing a plurality of program loops included in a program operation of the semiconductor memory device.

FIG. 17 is a diagram for describing a plurality of program loops included in a program operation of the semiconductor memory device.

Referring to FIG. 17, the program operation of the semiconductor memory device may include a plurality of program loops. As illustrated in FIG. 17, a first program loop $1^{st}$ PGM Loop may be first performed. After the first program loop $1^{st}$ PGM Loop is performed, a second program loop $2^{nd}$ PGM Loop may be performed if a program on memory cells included in a selected page has not been completed. After the second program loop $2^{nd}$ PGM Loop is performed, a third program loop $3^{rd}$ PGM Loop may be performed if the program on the memory cells included in the selected page has not been completed. In this way, a plurality of program loops may be repeatedly performed until the program on the memory cells included in the selected page is completed, or until the process reaches a maximum program loop.

The program operation of the semiconductor memory device may be performed using an incremental step pulse programming (ISPP) scheme. The ISPP scheme may be a scheme in which memory cells are programmed by gradually increasing a program voltage. As the program loops are performed, a program voltage to be applied in each program loop may be gradually increased.

As illustrated in FIG. 17, each of the plurality of program loops may include a channel precharge step, a program pulse application step, and a program verification step. The channel precharge step, the program pulse application step, and the program verification step are also referred to herein as the channel precharge operation, the program pulse application operation, and the program verify operation. At the channel precharge step, a channel voltage of cell strings included in a memory block selected as a target of the program operation may be precharged. In more detail, to increase a channel potential level of a cell string including a program inhibit cell, the channel voltage may be precharged.

At the program pulse application step, threshold voltages of program enable cells may be increased by applying a program voltage to a selected word line.

At the program verification step, it may be verified whether memory cells selected as program targets have been programmed to a desired level of voltage (hereinafter, referred to as "verify voltage") or more. As a results of the verify operation, a memory cell that has not been programmed to the verify voltage or more may operate as a program enable cell in a subsequent program loop. Here, a program pulse having a voltage level higher than that of the pervious program loop may be applied to program enable cells. A memory cell that has been programmed to the verify voltage or more may operate as a program inhibit cell in a subsequent program loop. Even if a program pulse is applied to the selected word line, the threshold voltage of the program inhibit cell may not increase.

In an embodiment of the present disclosure, the verify operation may also be performed in a manner similar to that used in the read operation. Hereinafter, description will be made with reference to FIGS. 18 to 21B.

Figure 19A:
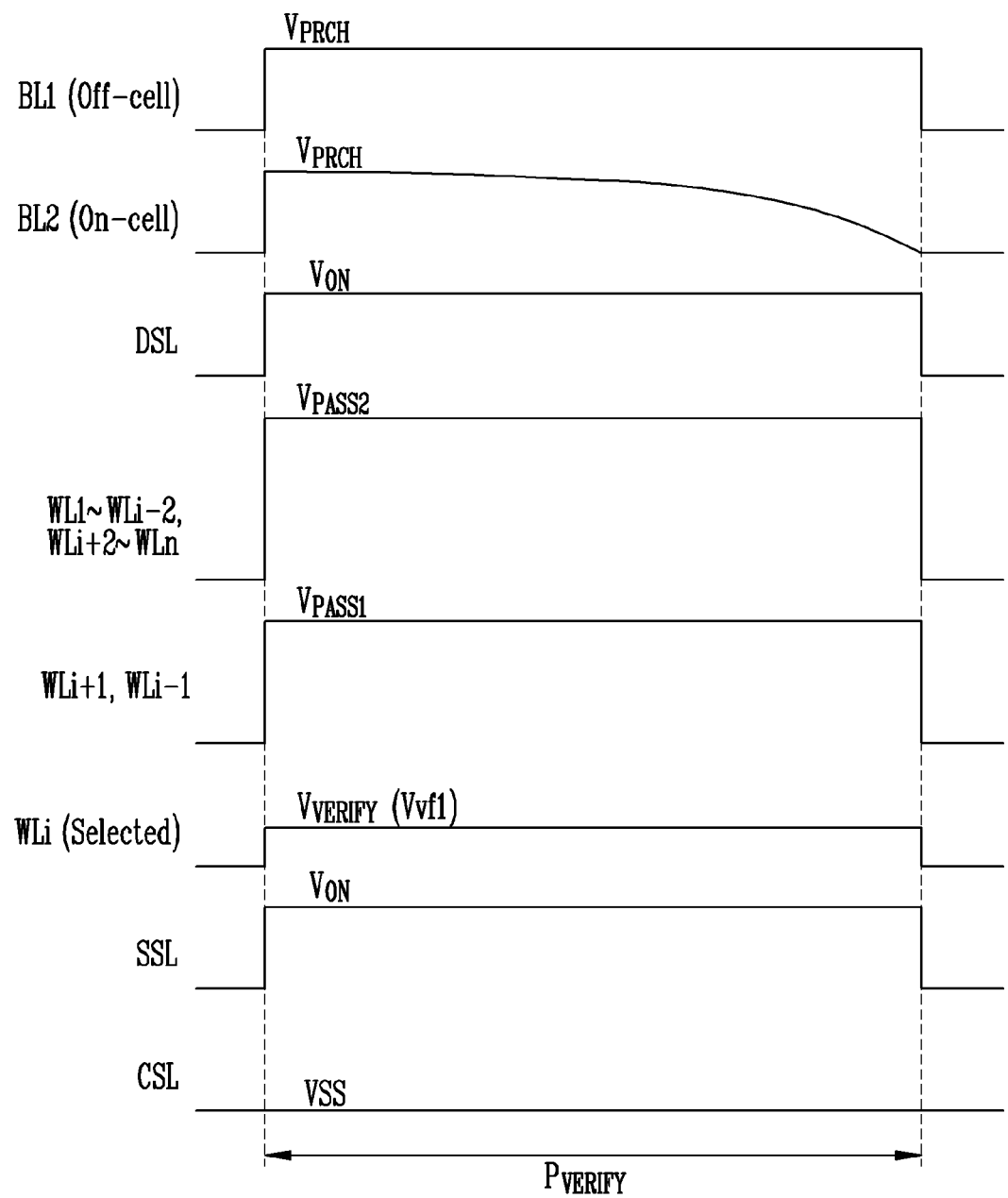
FIGS. 19A and 19B are timing diagrams for describing the method of operating the semiconductor memory device according to FIG. 18.
Figure 19B:
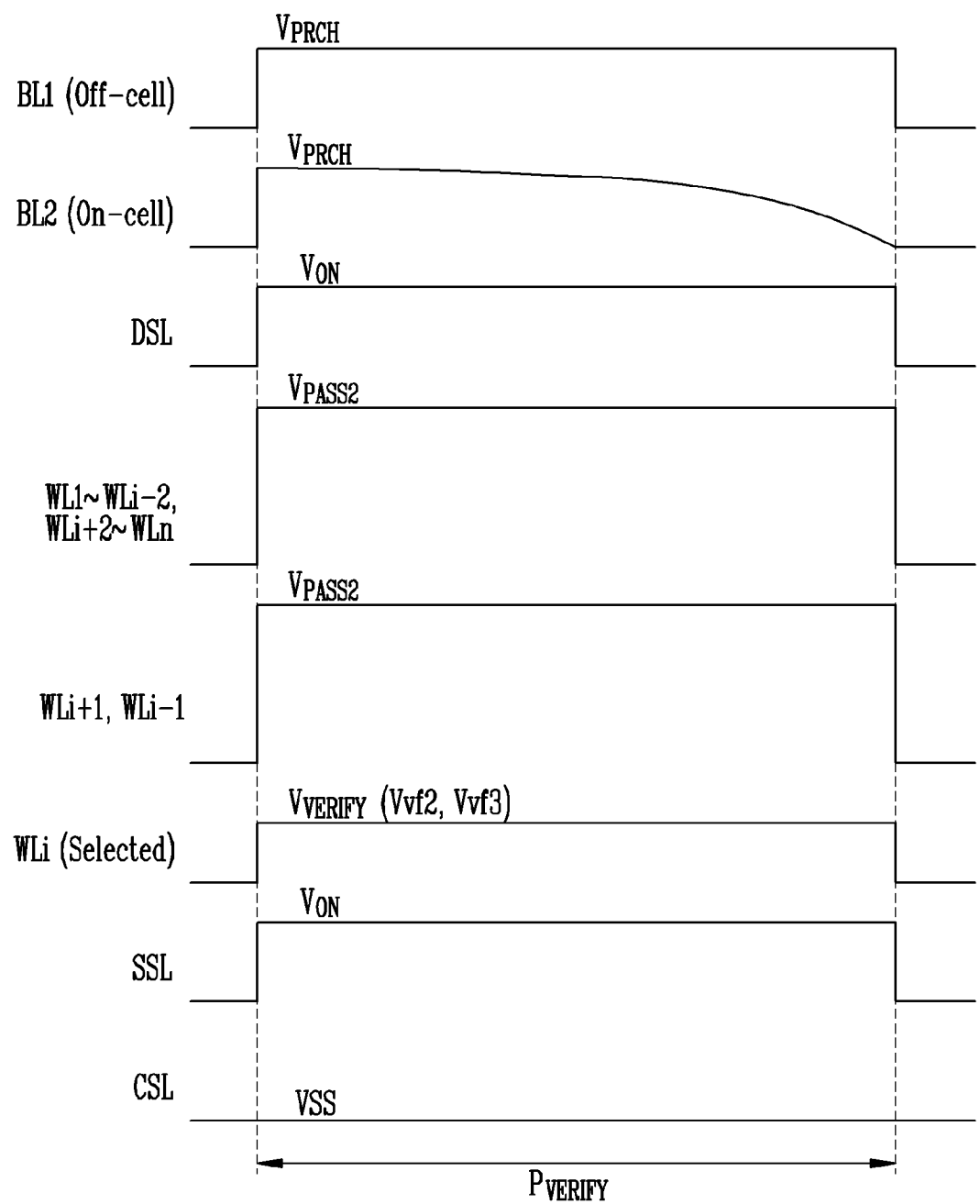

FIG. 18 is a flowchart illustrating a method of operating the semiconductor memory device in accordance with an embodiment of the present disclosure. FIGS. 19A and 19B are timing diagrams for describing the method of operating the semiconductor memory device according to FIG. 18. Hereinafter, the method of operating the semiconductor memory device in accordance with an embodiment of the present disclosure will be described with reference to FIGS. 18, 19A, and 19B.

Referring to FIG. 18, a program verify operation may be performed by the method of operating the semiconductor memory device in accordance with the embodiment of the present disclosure. The method of operating the semiconductor memory device illustrated in FIG. 18 may be performed at the verification step illustrated in FIG. 17.

In more detail, the method of operating the semiconductor memory device in accordance with the embodiment of the present disclosure may include step S410 of determining a verify voltage to be used in a verify operation among first to $2^N-1$-th verify voltages, step S420 of applying a precharge voltage to bit lines connected to selected memory cells, step S430 of applying a verify voltage to a word line connected to the memory cells selected as verify targets, and step S440 of determining whether a determined verify voltage is a first verify voltage. In accordance with an embodiment, the method of operating the semiconductor memory device my further include, in the case that the selected verify voltage is a first verify voltage (YES at S440), step S450 of applying a first read pass voltage to word lines that are adjacent to the selected word line, among unselected word lines, and step S460 of applying a second read pass voltage to word lines that are not adjacent to the selected word line among the unselected word lines. In an embodiment, the method of operating the semiconductor memory device may further include step S470 of applying a second read pass voltage to the unselected word lines in the case that the determined verify voltage is not the first verify voltage (NO at S440).

Referring to FIG. 19A, in the case that the verify voltage $V_{VERIFY}$ to be used in the verify operation is the first verify voltage Vvf1 (YES at S440), during a verify period $P_{VERIFY}$, different read pass voltages may be applied to the word lines (referred also to as "nonadjacent word lines") WL1 to WLi−2 and WLi+2 to WLn that are not adjacent to the selected word line WLi among the unselected word lines WL1 to WLi−1 and WLi+1 to WLn, and the word lines (referred also to as "adjacent word lines") WLi−1 and WLi+1 that are adjacent to the selected word line WLi. In other words, a first read pass voltage $V_{PASS1}$ which is relatively low may be applied to the adjacent word lines WLi−1 and WLi+1, and a second read pass voltage $V_{PASS2}$ which is relatively high may be applied to the nonadjacent word lines WL1 to WLi−2 and WLi+2 to WLn.

Referring to FIG. 19b, in the case that the verify voltage $V_{VERIFY}$ to be used in the verify operation is not the first verify voltage Vvf1 (NO at S440), during the verify period $P_{VERIFY}$, the second read pass voltage $V_{PASS2}$ may be applied to the unselected word lines WL1 to WLi−1 and WLi+1 to WLn (at step S470). In other words, the second read pass voltage $V_{PASS2}$ which is relatively high may be applied to both the adjacent word lines WLi−1 and WLi+1 and the nonadjacent word lines WL1 to WLi−2 and WLi+2 to WLn during the verify operation using the second verify voltage Vvf2 or the third verify voltage Vvf3.

Figure 21A:
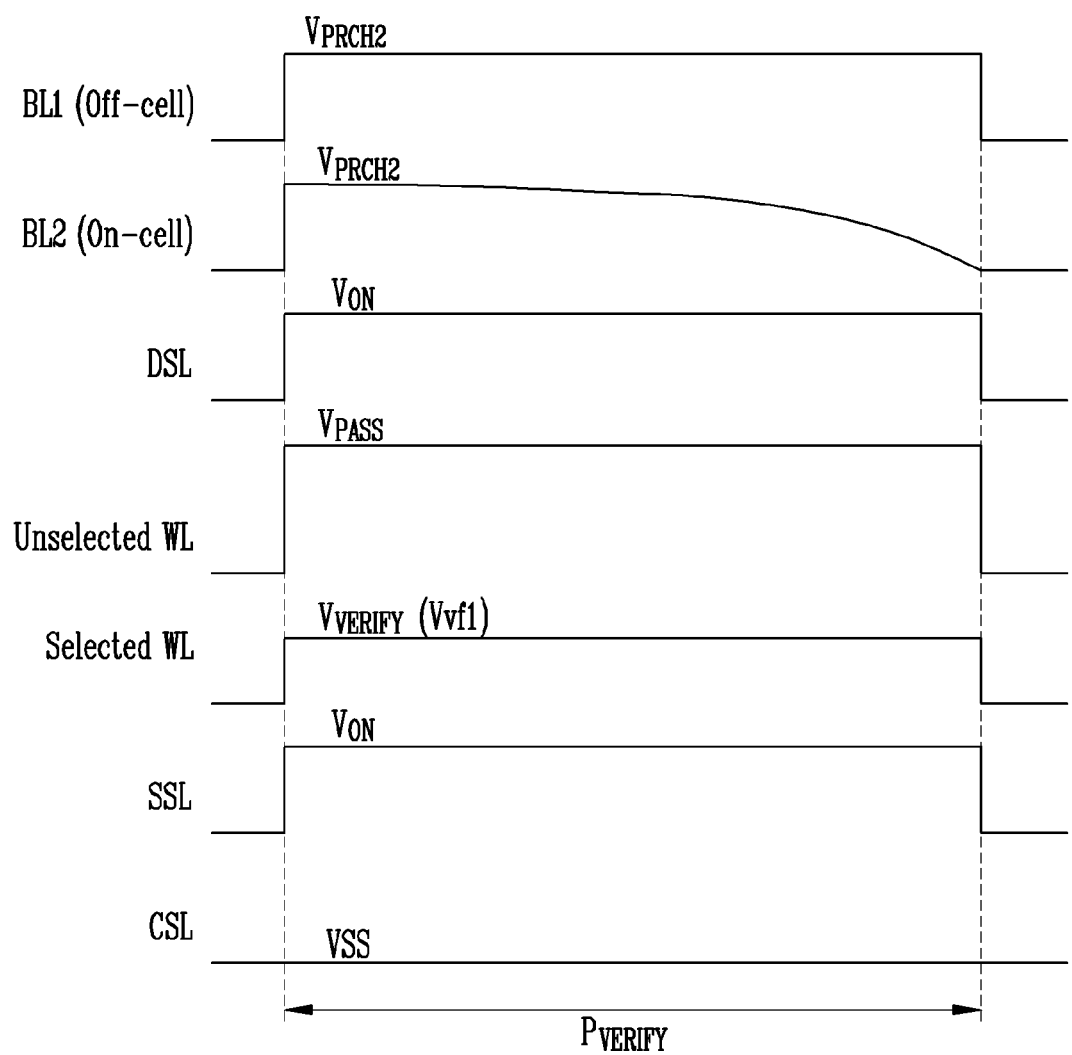
FIGS. 21A and 21B are timing diagrams for describing the method of operating the semiconductor memory device according to FIG. 20.
Figure 21B:
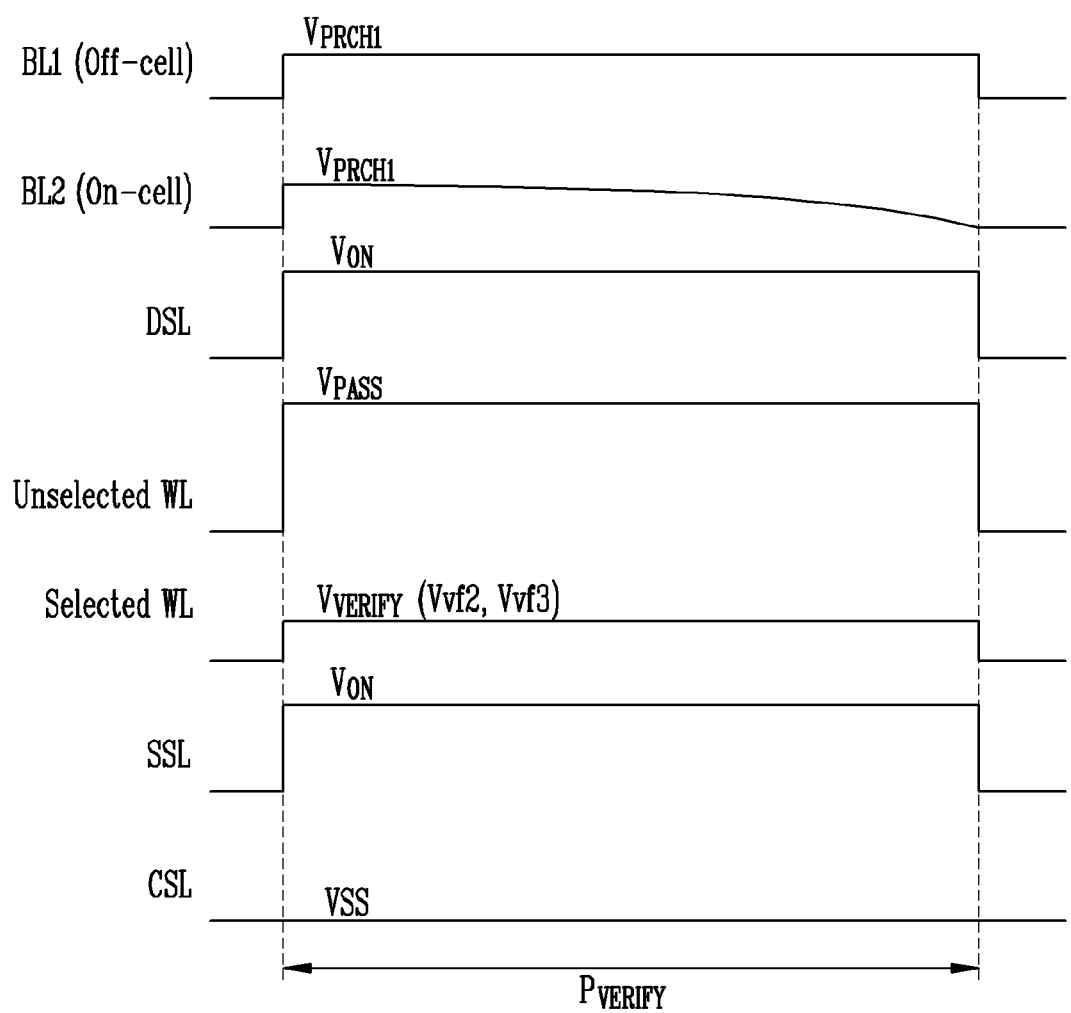

FIG. 20 is a flowchart illustrating a method of operating the semiconductor memory device in accordance with an embodiment of the present disclosure. FIGS. 21A and 21B are timing diagrams for describing the method of operating the semiconductor memory device according to FIG. 20. Hereinafter, the method of operating the semiconductor memory device will be described with reference to FIGS. 20, 21A, and 21B.

Referring to FIG. 20, a program verify operation may be performed by the method of operating the semiconductor memory device in accordance with the embodiment of the present disclosure. The method of operating the semiconductor memory device illustrated in FIG. 18 may be performed at the verify step illustrated in FIG. 17.

In more detail, the method may include step S510 of determining a verify voltage to be used in a verify operation among the first to $2^N-1$-th verify voltages, and step S520 of determining whether the determined verify voltage is a first verify voltage. In an embodiment, the method of operating the semiconductor memory device may further include step S530 of applying a second precharge voltage to the bit lines connected to the selected memory cells in the case that the determined verify voltage is the first verify voltage (YES at S520). In an embodiment, the method of operating the semiconductor memory device may further include step S540 of applying a first precharge voltage to the bit lines connected to the selected memory cells in the case that the determined verify voltage is not the first verify voltage (NO at S520). The method of operating the semiconductor memory device may further include step S550 of applying a verify voltage to the word line connected to the memory cells selected as the program targets, and step S560 of applying a read pass voltage to the unselected word lines.

At step S510, a verify voltage to be used in the verify operation among the first to $2^N-1$-th verify voltages is determined. The variable N may be a natural number equal to or greater than 2. Hereinafter, description will be focused on the case where the memory cells are MLCs.

At step S520, it may be determined whether the determined verify voltage is the first verify voltage. In the case that the determined verify voltage is the first verify voltage Vvf1 (YES at S520), a verify operation may be performed according to the timing diagram shown in FIG. 21A.

In the case that the determined verify voltage is the first verify voltage (YES at S520), a second precharge voltage may be applied to bit lines connected to memory cells selected at step S530. As shown in FIG. 21A, during the verify period P VERIFY/the bit lines BL1 and BL2 may be precharged. Hence, the voltages of the bit lines BL1 and BL2 may increase to the second precharge voltage $V_{PRCH2}$.

Thereafter, at step S550, a verify voltage may be applied to the word line connected to the memory cells selected as the program targets. Referring to FIG. 21A, the first verify voltage Vvf1 may be applied to a selected word line that is a word line connected to the selected memory cells.

At step S560, a read pass voltage $V_{PASS}$ may be applied to unselected word lines regardless of whether the unselected word lines are adjacent to the selected word line.

In the case that the determined verify voltage is not the first verify voltage Vvf1 (NO at S520), a verify operation may be performed according to the timing diagram shown in FIG. 21B.

In the case that the determined verify voltage is not the first verify voltage (NO at S520), a first precharge voltage may be applied to bit lines connected to memory cells selected at step S540. As shown in FIG. 21B, during the verify period $P_{VERIFY}$, the bit lines BL1 and BL2 may be precharged. Hence, the voltages of the bit lines BL1 and BL2 may increase to the first precharge voltage $V_{PRCH1}$.

Referring to FIGS. 21A and 21B, the second precharge voltage $V_{PRCH2}$ may be greater than the first precharge voltage $V_{PRCH1}$. In other words, in the case that the verify voltage to be used in the verify operation is the first verify voltage Vvf1, the second precharge voltage $V_{PRCH1}$ which is relatively high may be used to perform a precharge operation. In the case that the verify voltage to be used in the verify operation is not the first verify voltage Vvf1, the first precharge voltage $V_{PRCH1}$ which is relatively low may be used to perform the precharge operation. Hence, during the read operation, Z-interference which acts in a cell string direction may be reduced, so that the probability of an occurrence of a read failure may be reduced.

Figure 22:
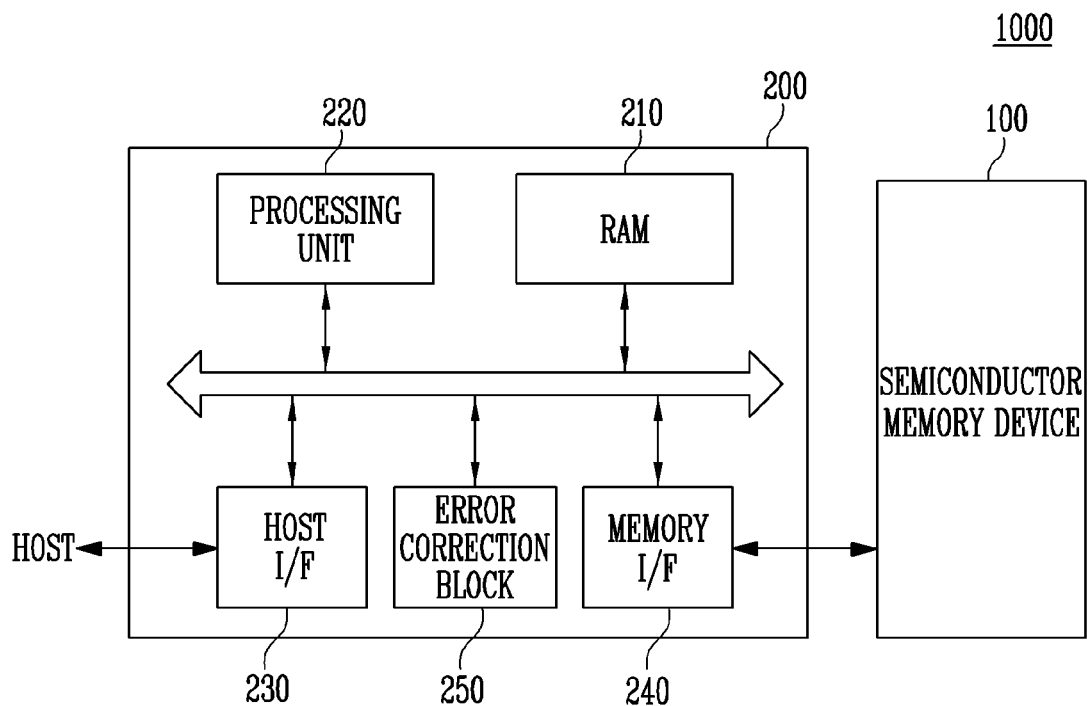
FIG. 22 is a block diagram illustrating an example of the controller shown in FIG. 1.

FIG. 22 is a block diagram illustrating an example of the controller 200 shown in FIG. 1.

Referring to FIG. 22, the controller 200 is connected with a semiconductor memory device 100 and a host. The semiconductor memory device 100 may be the semiconductor memory device described with reference to FIG. 2.

The controller 200 may access the semiconductor memory device 100 in response to a request from the host. For example, the controller 200 may control a read operation, a write operation, an erase operation, and a background operation of the semiconductor memory device 100. The controller 200 may provide an interface between the semiconductor memory device 100 and the host. The controller 200 may drive firmware for controlling the semiconductor memory device 100.

The controller 200 may include a random access memory (RAM) 210, a processing unit 220, a host interface 230, a memory interface 240, and an error correction block 250. The RAM 210 may be used as at least one of an operating memory for the processing unit 220, a cache memory between the semiconductor memory device 100 and the host, and a buffer memory between the semiconductor memory device 100 and the host.

The processing unit 220 may control the overall operation of the controller 200.

The host interface 230 may include a protocol for performing data exchange between the host and the controller 200. In an embodiment, the controller 200 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, and an integrated drive electronics (IDE) protocol, and a private protocol.

The memory interface 240 may interface with the semiconductor memory device 100. For example, the memory interface may include a NAND interface or a NOR interface.

The error correction block 250 may use an error correcting code (ECC) to detect and correct an error in data received from the semiconductor memory device 100. The processing unit 220 may control the semiconductor memory device 100 to adjust the read voltage according to an error detection result from the error correction block 250 and perform re-reading.

The controller 200 and the semiconductor memory device 100 may be integrated into a single semiconductor device. In an embodiment, the controller 200 and the semiconductor memory device 100 may be integrated into a single semiconductor device to form a memory card. For example, the controller 200 and the semiconductor memory device 100 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), and a universal flash storage (UFS).

The controller 200 and the semiconductor memory device 100 may be integrated into a single semiconductor device to form a solid state drive (SSD). The SSD may include a memory system 1000 configured to store data in a semiconductor memory. When the memory system 1000 including the controller 200 and the semiconductor memory device 100 is used as the SSD, the operating speed of the host connected to the memory system 1000 can be phenomenally improved.

In an embodiment, the memory system 1000 including the controller 200 and the semiconductor memory device 100 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 and the memory system including the semiconductor memory device 100 may be embedded in various types of packages. For example, the semiconductor memory device 100 or the memory system may be packaged in a type such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline integrated circuit (SOIC), a shrink small outline package (SSOP), a thin small outline package (TSOP), a system in package (SIP), a multi-chip package (MCP), a wafer-level fabricated package (WFP), a wafer-level processed stack package (WSP), or the like.

Figure 23:
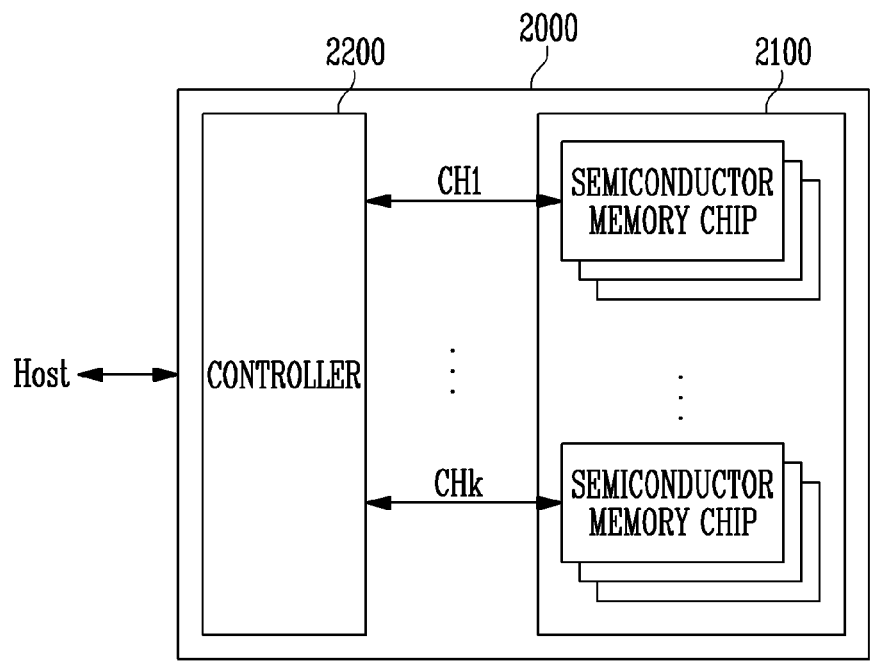
FIG. 23 is a block diagram illustrating an application example of the memory system of FIG. 22.

FIG. 23 is a block diagram illustrating an application example of the memory system 2000 of FIG. 22.

Referring to FIG. 23, the memory system 2000 may include a semiconductor memory device 2100 and a controller 2200. The semiconductor memory device 2100 may include a plurality of semiconductor memory chips. The semiconductor memory chips may be divided into a plurality of groups.

In FIG. 23, it is illustrated that the respective groups communicate with the controller 2200 through first to k-th channels CH1 to CHk. Each semiconductor memory chip may be configured and operated in the same manner as those of the semiconductor memory device 100 described with reference to FIG. 2.

Each group may communicate with the controller 2200 through one common channel. The controller 2200 may have the same configuration as that of the controller 200 described with reference to FIG. 22 and control a plurality of memory chips of the semiconductor memory device 2100 through the plurality of channels CH1 to CHk.

Figure 24:
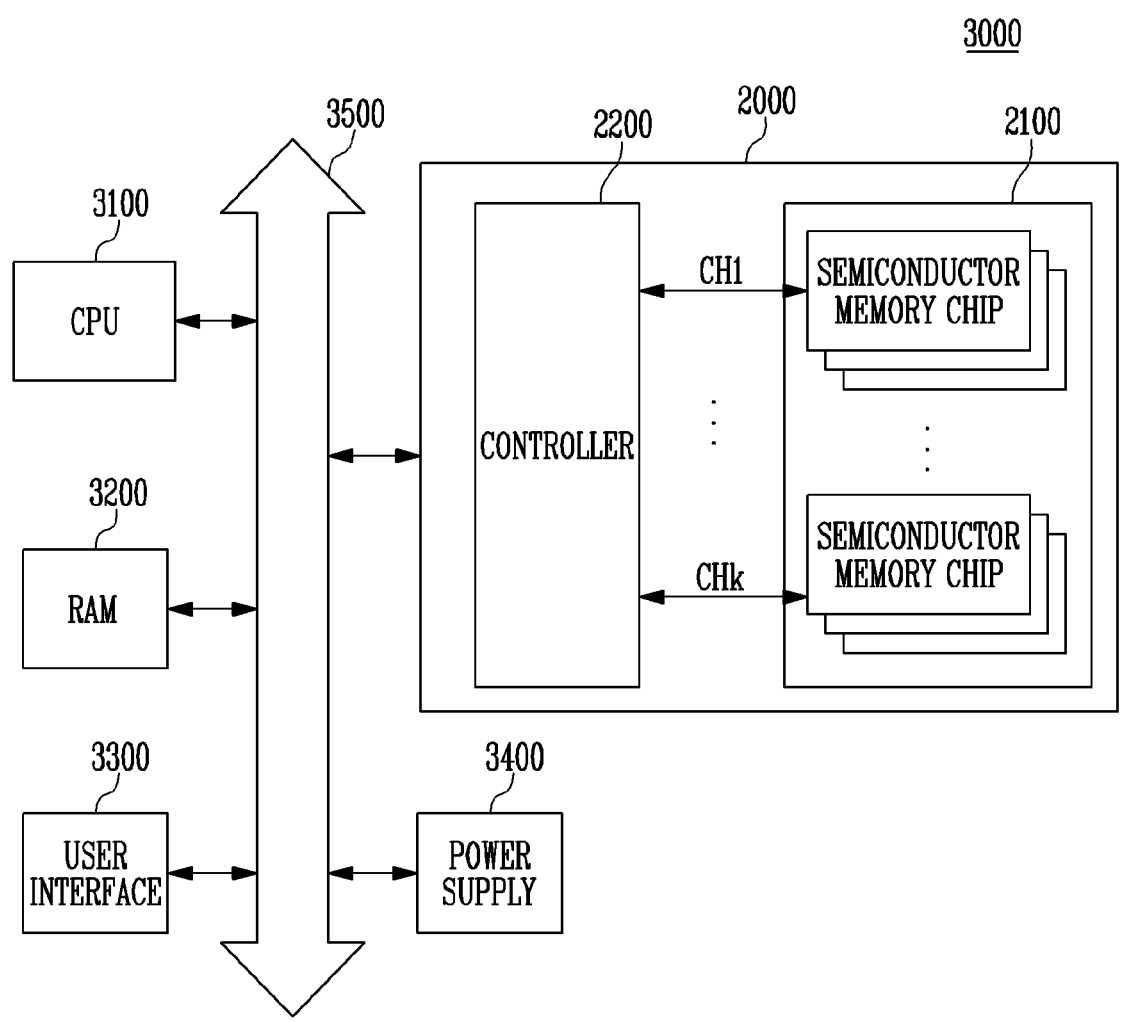
FIG. 24 is a block diagram illustrating a computing system including the memory system described with reference to FIG. 23.

FIG. 24 is a block diagram illustrating a computing system 3000 including the memory system 2000 described with reference to FIG. 23.

The computing system 3000 may include a central processing unit (CPU) 3100, RAM 3200, a user interface 3300, a power supply 3400, a system bus 3500, and the memory system 2000.

The memory system 2000 may be electrically connected to the CPU 3100, the RAM 3200, the user interface 3300, and the power supply 3400 through the system bus 3500. Data provided through the user interface 3300 or processed by the CPU 3100 may be stored in the memory system 2000.

In FIG. 24, the semiconductor memory device 2100 has been illustrated as being connected to the system bus 3500 through the controller 2200. Furthermore, the semiconductor memory device 2100 may be directly connected to the system bus 3500. The function of the controller 2200 may be performed by the CPU 3100 and the RAM 3200.

In FIG. 24, it is illustrated that the memory system 2000 described with reference to FIG. 23 is provided. However, the memory system 2000 may be replaced with the memory system 1000 including the controller 200 and the semiconductor memory device 100 that have been described with reference to FIG. 22.

Various embodiments of the present disclosure are directed to a semiconductor memory device capable of improving read and program performance, and a method of operating the semiconductor memory device.

The embodiments disclosed in the present disclosure and the drawings aim to help those with ordinary skill in the art to more clearly understand the present disclosure rather than aiming to limit the bounds of the present disclosure. Therefore, one of ordinary skill in the art to which the present disclosure belongs will be able to understand that various modifications are possible based on the technical scope of the present disclosure.

What is claimed is:

1. A method of operating a semiconductor memory device configured to perform a read operation on selected memory cells, the method comprising:
   determining a read voltage to be used in the read operation among first to $2^N-1$-th read voltages, wherein N is a natural number of 2 or more;
   applying a determined read voltage to a selected word line connected to the selected memory cells; and
   applying a first read pass voltage or a second read pass voltage greater than the first read pass voltage to adjacent word lines that are adjacent to the selected word line among unselected word lines based on whether the determined read voltage is the first read voltage among the first to $2^N-1$-th read voltages.

2. The method according to claim 1, wherein applying the first read pass voltage or the second read pass voltage to the adjacent word lines based on whether the determined read voltage is the first read voltage comprises, in response to a determination that the determined read voltage is the first read voltage:
   applying the first read pass voltage to word lines that are not adjacent to the selected word line among the unselected word lines; and
   applying the second read pass voltage greater than the first read pass voltage to the adjacent word lines that are adjacent to the selected word line among the unselected word lines.

3. The method according to claim 1, wherein applying the first read pass voltage or the second read pass voltage to the adjacent word lines based on whether the determined read voltage is the first read voltage comprises applying the first read pass voltage to the adjacent word lines, in response to a determination that the determined read voltage is not the first read voltage.

4. The method according to claim 1, further comprising applying a precharge voltage to bit lines connected to the selected memory cells.

5. The method according to claim 1, wherein the first read voltage is a read voltage to determine whether the selected memory cells are in an erased state or a first programmed state.

6. A method of operating a semiconductor memory device configured to perform a read operation on selected memory cells, the method comprising:
   determining a read voltage to be used in the read operation among first to $2^N-1$-th read voltages, wherein N is a natural number of 2 or more;
   applying a first precharge voltage or a second precharge voltage greater than the first precharge voltage to bit lines connected to the selected memory cells, based on whether a determined read voltage is the first read voltage among the first to $2^N-1$-th read voltages; and
   applying the determined read voltage to a selected word line connected to the selected memory cells.

7. The method according to claim 6, wherein applying the first precharge voltage or the second precharge voltage greater than the first precharge voltage to the bit lines connected to the selected memory cells, based on whether the determined read voltage is the first read voltage, comprises applying the first precharge voltage to the bit lines, in response to a determination that the determined read voltage is the first read voltage.

8. The method according to claim 7, further comprising:
   applying a first read pass voltage to word lines that are not adjacent to the selected word line, among unselected word lines; and
   applying a second read pass voltage greater than the first read pass voltage to word lines that are adjacent to the selected word line among the unselected word lines.

9. The method according to claim 6, wherein applying the first precharge voltage or the second precharge voltage greater than the first precharge voltage to the bit lines connected to the selected memory cells, based on whether the determined read voltage is the first read voltage, comprises applying the second precharge voltage to the bit lines, in response to a determination that the determined read voltage is not the first read voltage.

10. The method according to claim 9, further comprising:
    applying a first read pass voltage to unselected word lines.

11. A method of operating a semiconductor memory device configured to perform a program operation on selected memory cells, wherein the program operation comprises a plurality of program loops, each of the plurality of program loops comprising a program pulse application operation and a program verify operation, wherein the program verify operation comprises:
    determining a verify voltage to be used in a verify operation among first to $2^N-1$-th verify voltages, wherein N is a natural number of 2 or more;
    applying a determined verify voltage to a selected word line connected to the selected memory cells; and
    applying a first read pass voltage or a second read pass voltage greater than the first read pass voltage to adjacent word lines that are adjacent to the selected word line among unselected word lines based on whether the determined verify voltage is the first verify voltage among the first to $2^N-1$-th verify voltages.

12. The method according to claim 11, wherein applying the first read pass voltage or the second read pass voltage to the adjacent word lines based on whether the determined verify voltage is the first verify voltage comprises, in response to a determination that the determined verify voltage is the first verify voltage:
    applying the first read pass voltage to the adjacent word lines that are adjacent to the selected word line among the unselected word lines; and
    applying the second read pass voltage greater than the first read pass voltage to word lines that are not adjacent to the selected word line among the unselected word lines.

13. The method according to claim 11, wherein applying the first read pass voltage or the second read pass voltage to the adjacent word lines based on whether the determined verify voltage is the first verify voltage comprises applying the second read pass voltage to the adjacent word lines, in response to a determination that the determined verify voltage is not the first verify voltage.

14. The method according to claim 11, wherein the program verify operation further comprises applying a precharge voltage to bit lines connected to the selected memory cells.

15. The method according to claim 11, wherein the first verify voltage is a voltage for verifying threshold voltages of memory cells to be programmed to a first programmed state among first to $2^N-1$-th programmed states.

16. A method of operating a semiconductor memory device configured to perform a program operation on selected memory cells, wherein the program operation comprises a plurality of program loops, each of the plurality of program loops comprising a program pulse application operation and a program verify operation, wherein the program verify operation comprises:
  determining a verify voltage to be used in a verify operation among first to $2^N-1$-th verify voltages, wherein N is a natural number of 2 or more;
  applying a first precharge voltage or a second precharge voltage greater than the first precharge voltage to bit lines connected to the selected memory cells, based on whether a determined verify voltage is the first verify voltage among the first to $2^N-1$-th verify voltages; and
  applying the determined verify voltage to a selected word line connected the selected memory cells.

17. The method according to claim 16, wherein applying the first precharge voltage or the second precharge voltage greater than the first precharge voltage to the bit lines connected to the selected memory cells, based on whether the determined verify voltage is the first verify voltage comprises applying the second precharge voltage to the bit lines, in response to a determination that the determined verify voltage is the first verify voltage.

18. The method according to claim 16, wherein applying the first precharge voltage or the second precharge voltage greater than the first precharge voltage to the bit lines connected to the selected memory cells, based on whether the determined verify voltage is the first verify voltage, comprises applying the first precharge voltage to the bit lines, in response to a determination that the determined verify voltage is not the first verify voltage.

19. The method according to claim 16, wherein the program verify operation comprises:
  applying a read pass voltage to unselected word lines.

* * * * *